(12) United States Patent
Lopatin et al.

(10) Patent No.: US 7,704,352 B2
(45) Date of Patent: Apr. 27, 2010

(54) HIGH-ASPECT RATIO ANODE AND APPARATUS FOR HIGH-SPEED ELECTROPLATING ON A SOLAR CELL SUBSTRATE

(75) Inventors: Sergey Lopatin, Morgan Hill, CA (US); Nicolay Y. Kovarsky, Sunnyvale, CA (US); David Eaglesham, Perrysburg, OH (US); John O. Dukovic, Palo Alto, CA (US); Charles Gay, Westlake Village, CA (US)

(73) Assignee: Applied Materials, Inc., Santa Clara, CA (US)

( * ) Notice: Subject to any disclaimer, the term of this patent is extended or adjusted under 35 U.S.C. 154(b) by 685 days.

(21) Appl. No.: 11/566,202

(22) Filed: Dec. 1, 2006

(65) Prior Publication Data

US 2008/0128268 A1   Jun. 5, 2008

(51) Int. Cl.
*C25D 17/00* (2006.01)
(52) U.S. Cl. .................. 204/198; 204/206; 205/129
(58) Field of Classification Search ............. 204/193, 204/198, 224 R; 205/96, 118, 122, 133, 205/135, 183
See application file for complete search history.

(56) References Cited

U.S. PATENT DOCUMENTS

| | | | |
|---|---|---|---|
| 3,849,880 A | 11/1974 | Haynos | |
| 4,240,880 A * | 12/1980 | Tsuchibuchi et al. | ........ 205/133 |
| 4,436,558 A | 3/1984 | Russak | |
| 4,581,108 A | 4/1986 | Kapur et al. | |
| 4,617,420 A | 10/1986 | Dilts et al. | |
| 4,623,751 A | 11/1986 | Kishi et al. | |
| 4,666,567 A | 5/1987 | Loch | |
| 4,789,437 A | 12/1988 | Sing et al. | |
| 4,869,971 A | 9/1989 | Nee et al. | |
| 5,057,163 A | 10/1991 | Barnett et al. | |
| 5,198,965 A | 3/1993 | Curtis et al. | |
| 5,209,817 A | 5/1993 | Ahmad et al. | |
| 5,277,786 A | 1/1994 | Kawakami | |
| 5,575,855 A | 11/1996 | Kanai et al. | |
| 5,588,994 A | 12/1996 | Bozler et al. | |
| 5,841,197 A | 11/1998 | Adamic et al. | |

(Continued)

OTHER PUBLICATIONS

PCT International Search Report and Written Opinion dated Apr. 9, 2009, International Application No. PCT/US07/85959.

(Continued)

*Primary Examiner*—Nam X Nguyen
*Assistant Examiner*—Luan V Van
(74) *Attorney, Agent, or Firm*—Patterson & Sheridan, LLP

(57) ABSTRACT

Embodiments of the invention contemplate the formation of a low cost solar cell using a novel high speed electroplating method and apparatus to form a metal contact structure having selectively formed metal lines using an electrochemical plating process. The apparatus and methods described herein remove the need to perform one or more high temperature screen printing processes to form conductive features on the surface of a solar cell substrate. The resistance of interconnects formed in a solar cell device greatly affects the efficiency of the solar cell. It is thus desirable to form a solar cell device that has a low resistance connection that is reliable and cost effective. Therefore, one or more embodiments of the invention described herein are adapted to form a low cost and reliable interconnecting layer using an electrochemical plating process containing a common metal, such as copper.

28 Claims, 27 Drawing Sheets

U.S. PATENT DOCUMENTS

| | | | |
|---|---|---|---|
| 5,897,368 | A | 4/1999 | Cole, Jr. et al. |
| 5,968,333 | A | 10/1999 | Nogami et al. |
| 5,972,192 | A | 10/1999 | Dubin et al. |
| 6,103,085 | A * | 8/2000 | Woo et al. ............... 205/143 |
| 6,197,181 | B1 | 3/2001 | Chen |
| 6,261,433 | B1 | 7/2001 | Landau |
| 6,294,822 | B1 | 9/2001 | Nakata |
| 6,297,155 | B1 | 10/2001 | Simpson et al. |
| 6,299,745 | B1 | 10/2001 | Kumar et al. |
| 6,391,166 | B1 | 5/2002 | Wang |
| 6,406,610 | B1 | 6/2002 | Lowe |
| 6,447,938 | B1 | 9/2002 | Bianchi |
| 6,559,479 | B1 | 5/2003 | Ludemann |
| 6,572,742 | B1 | 6/2003 | Cohen |
| 6,610,189 | B2 * | 8/2003 | Wang et al. ............... 205/88 |
| 6,670,543 | B2 | 12/2003 | Lohmeyer et al. |
| 6,706,166 | B2 * | 3/2004 | Chou et al. ............... 205/96 |
| 6,881,318 | B2 | 4/2005 | Hey et al. |
| 7,172,184 | B2 | 2/2007 | Pavani et al. |
| 7,339,110 | B1 | 3/2008 | Mulligan et al. |
| 7,388,147 | B2 | 6/2008 | Mulligan et al. |
| 2003/0192583 | A1 | 10/2003 | Ryan |
| 2003/0230337 | A1 | 12/2003 | Gaudiana et al. |
| 2004/0067324 | A1 | 4/2004 | Lazarev et al. |
| 2004/0074762 | A1 | 4/2004 | Keigler et al. |
| 2004/0118446 | A1 | 6/2004 | Toyomura |
| 2004/0198187 | A1 | 10/2004 | Tolles |
| 2004/0200520 | A1 | 10/2004 | Mulligan et al. |
| 2005/0061665 | A1 | 3/2005 | Pavani et al. |
| 2005/0103377 | A1 | 5/2005 | Saneyuki et al. |
| 2005/0121326 | A1 | 6/2005 | Klocke et al. |
| 2005/0199489 | A1 | 9/2005 | Stevens et al. |
| 2005/0272263 | A1 | 12/2005 | Brabec et al. |
| 2006/0033678 | A1 | 2/2006 | Lubomirsky et al. |
| 2006/0062897 | A1 | 3/2006 | Gu et al. |
| 2006/0174935 | A1 | 8/2006 | Sawada et al. |
| 2006/0185714 | A1 | 8/2006 | Nam et al. |
| 2006/0185716 | A1 | 8/2006 | Murozono et al. |
| 2006/0207885 | A1 | 9/2006 | Basol |
| 2006/0217049 | A1 | 9/2006 | Li et al. |
| 2006/0219565 | A1 | 10/2006 | Preusse et al. |
| 2006/0223300 | A1 | 10/2006 | Simka et al. |
| 2008/0092947 | A1 | 4/2008 | Lopatin et al. |
| 2008/0121276 | A1 | 5/2008 | Lopatin et al. |
| 2008/0128013 | A1 * | 6/2008 | Lopatin et al. ............... 136/244 |
| 2008/0128019 | A1 | 6/2008 | Lopatin et al. |
| 2008/0128268 | A1 | 6/2008 | Lopatin et al. |

OTHER PUBLICATIONS

International Search Report, May 2, 2008.
International Search Report. Sep. 19, 2008.
Prosecution History for U.S. Appl. No. 11/566,205.
Popov, et al., "The Relationship Between The Effective Current Density And The Effective Overpotential In Copper Deposition By The Pulsating Potential", Institute of Chemistry, Technology and Metallurgy, Beograd, Yugoslavia, Journal Of Applied Electrochemistry 4 (1974), pp. 267-273.
Puippe, et al., "The Morphology Of Pulse-Plated Deposits", Plating And Surface Finishing, Jun. 1980, pp. 68-72, (Based on a presentation made at the AES International Symposium on Pulse Plating, Apr. 19-20, 1979).
Kray, et al "High-Efficiency Emitter-Wrap-Through Cells", 17th EU-PVSEC Munich (2001), Paper OA8.1, pp. 1-4.
Eager, et al. "Environmentally Friendly Processes in the Manufacture of Saturn Solar Cells", 2002 IEEE, pp. 62-65.
Domeier, et al. "Microscreen-based Replication of Electroforming Micromolds", Microsystem Technologies 8 (2002), pp. 78-82.
Fredenberg, et al. "Recent Progress in the Development of ECPR (ElectroChemical Pattern Replication) Metal Printing for Microelectronics", 208th ECS Meeting, Oct. 16-21, 2005, Los Angeles, California, Abstract #682.
Weeber, et al. "How to Achieve 17% Cell Efficiencies on Large Back-Contacted Mc-Si Solar Cells", 2006 IEEE 4th World Conference on Photovoltaic Energy Conversion, May 7-12, 2006, Hawaii, pp. 1-4.
Granek, et al. "A Systematic Approach to Reduce Process-Induced Shunts in Back-Contacted Mc-Si Solar Cells", 2006 IEEEE 4th World Conference on Photovoltaic Energy Conversion, May 7-12, 2006 Hawaii, pp. 1-4.
Lee, et al. "Correlation of Stress and Texture Evolution During Self- and Thermal Annealing of Electroplated Cu Films", 2000 IEEE, pp. 114-116.
Lee, et al. "Evidence of Dislocation Loops as a Driving Force for Self-Annealing in Electroplated Cu Films", 2001 IEEE, pp. 236-238.
Lopatin, et al. "Electroless Cu and Barrier Layers for Sub-Half Micron Multilevel Interconnects", SPIE vol. 3214, pp. 21-32.
Eikelbloom, et al. "Conductive Adhesives for Low-Stress Interconnection of Thin Back-Contact Solar Cells", 29th IEEE Photovoltaic Specialists Conference, May 20-24, 2002, New Orleans, pp. 1-4, http://www.ecn.nl/docs/library/report/2002/rx02052.pdf.
Schubert, et al. "Flexible Solar Cells for Clothing", Materials Today, Jun. 2006, vol. 9 No. 6, pp. 42-50.

* cited by examiner

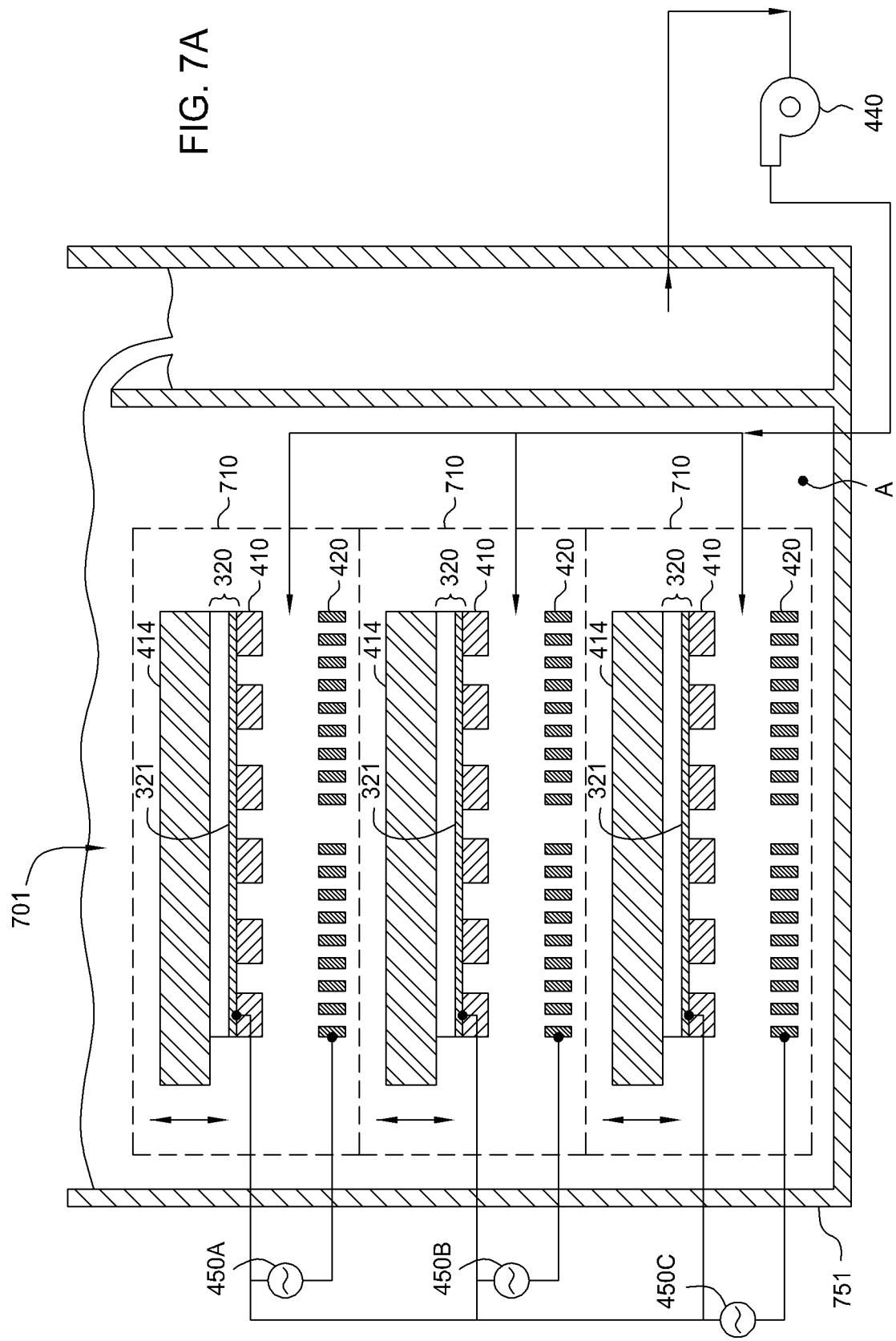

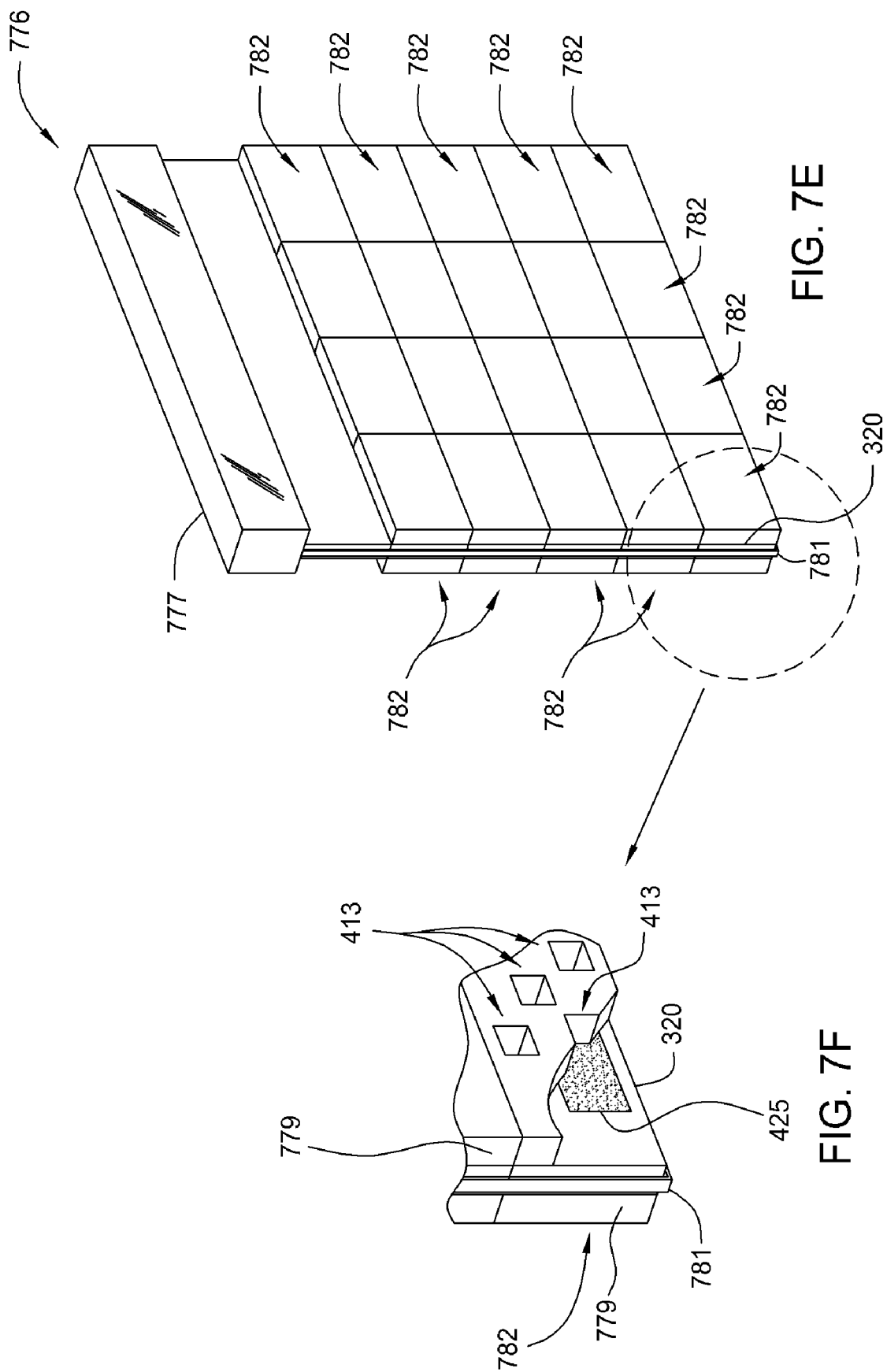

HIGH-ASPECT RATIO ANODE AND APPARATUS FOR HIGH-SPEED ELECTROPLATING ON A SOLAR CELL SUBSTRATE

CROSS-REFERENCE TO RELATED APPLICATIONS

This application is related to the U.S. patent application Ser. No. 11/566,205 entitled "Precision Printing Electroplating Through Plating Mask On A Solar Cell Substrate" by Sergey Lopatin et al., filed Dec. 1, 2006, the U.S. patent application Ser. No. 11/566,201 entitled "Method Of Metallizing A Solar Cell Substrate" by Sergey Lopatin et al., filed Dec. 1, 2006, and the U.S. patent application Ser. No. 11/566,205 entitled "Electroplating On Roll-to-Roll Flexible Solar Cell Substrates" by Sergey Lopatin et al., filed Dec. 1, 2006, which are all herein incorporated by reference.

BACKGROUND OF THE INVENTION

1. Field of the Invention

Embodiments of the present invention generally relate to the fabrication of photovoltaic cells.

2. Description of the Related Art

Solar cells are photovoltaic devices that convert sunlight directly into electrical power. The most common solar cell material is silicon, which is in the form of single or polycrystalline wafers. Because the amortized cost of forming a silicon-based solar cells to generate electricity is higher than the cost of generating electricity using traditional methods, there has been an effort to reduce the cost to form solar cells.

FIGS. 1A and 1B schematically depicts a standard silicon solar cell 100 fabricated on a wafer 110. The wafer 110 includes a p-type base region 101, an n-type emitter region 102, and a p-n junction region 103 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus, the dopant atom can accept an electron from a neighboring atom's covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 103. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 120, i.e. the light-receiving side, and the backside 121 of the solar cell 100. The top contact structure, as shown in FIG. 1A, is generally configured as widely-spaced thin metal lines, or fingers 104, that supply current to a larger bus bar 105. The back contact 106 is generally not constrained to be formed in multiple thin metal lines, since it does not prevent incident light from striking solar cell 100. Solar cell 100 is generally covered with a thin layer of dielectric material, such as $Si_3N_4$, to act as an anti-reflection coating 111, or ARC, to minimize light reflection from the top surface of solar cell 100.

In the interest of simplified assembly and higher efficiency of solar cells, a solar cell has been developed, wherein a plurality of holes is formed through the solar cell substrate and serves as vias for interconnection of the top contact structure to a backside conductor by using pins. This solar cell design is referred to as a pin-up module, or PUM. One advantage of the PUM concept is the elimination of the busbars, such as bus bar 105 illustrated in FIG. 1A, from covering the light-receiving side of the substrate, thereby increasing efficiency of the cell. Another is that resistive losses are reduced because current produced by the solar cell is collected at holes equally spaced over the substrate rather than requiring some of the connections to extend across the surface of the solar cell. Further, resistive losses experienced by a PUM connected device will not increase as the solar cell surface area increases and, hence, larger solar cells may be manufactured without a loss in efficiency.

FIG. 1C is a partial schematic cross section of one example of a PUM cell 130 showing a contact 134. Similar to a standard solar cell, such as solar cell 100, PUM cell 130 includes a single crystal silicon wafer 110 with a p-type base region 101, an n-type emitter region 102, and a p-n junction region 103 disposed therebetween. PUM cell 130 also includes a plurality of through-holes 131, which are formed between the light-receiving surface 132 and the backside 133 of PUM cell 130. The through-holes 131 allow the formation of contact 134 between the light-receiving surface 132 and the backside 133. Disposed in each through-hole 131 is a contact 134, which includes a top contact structure 135 disposed on light-receiving surface 132, a backside contact 136 disposed on backside 133, and an interconnect 137, which fills through-hole 131 and electrically couples top contact structure 135 and backside contact 136. An anti-reflective coating 107 may also be formed on light receiving surface 132 to minimize reflection of light energy therefrom. A backside contact 139 completes the electrical circuit required for PUM cell 130 to produce a current by forming an ohmic contact with p-type base region 101 of the silicon wafer 110.

The fingers 104 (FIG. 1B) or contact 134 (FIG. 1C) are in contact with the substrate are adapted to form an ohmic connection with doped region (e.g., n-type emitter region 102). An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. Hence, after the fingers 104, or contacts 134, have been formed on the light-receiving surface and on the backside, an annealing process of suitable temperature and duration is typically performed in order to produce the necessary low resistance metal silicide at the contact/semiconductor interface. A backside contact completes the electrical circuit required for solar cell to produce a current by forming an ohmic contact with p-type base region of the substrate.

Wider the current carrying metal lines (e.g., fingers 104, contact 134) are on the light-receiving surface of the solar cell the lower the resistance losses, but the higher the shadowing losses due to the reduced effective surface area of the light-receiving surface. Therefore, maximizing solar cell efficiency requires balancing these opposing design constraints. FIG. 1D illustrates a plan view of one example of a top contact structure 135 for a PUM cell, wherein the finger width and geometry have been optimized to maximize cell efficiency for the cell. In this configuration, a top contact structure 135 for a PUM cell is configured as a grid electrode 138, which consists of a plurality of various width finger segments 135A. The width of a particular finger segment 135A is selected as a function of the current to be carried by that finger segment 135A. In addition, finger segments 135A are configured to branch as necessary to maintain finger spacing as a function of finger width. This minimizes resistance losses as well as shadowing by finger segments 135A.

Traditionally, the current carrying metal lines, or conductors, are fabricated using a screen printing process in which a silver-containing paste is deposited in a desired pattern on a substrate surface and then annealed. However, there are several issues with this manufacturing method. First, the thin fingers of the conductors, when formed by the screen printing process, may be discontinuous since the fingers formed using a metal paste do not always agglomerate into a continuous interconnecting line during the annealing process. Second, porosity present in the fingers formed during the agglomeration process results in greater resistive losses. Third, electrical shunts may be formed by diffusion of the metal (e.g., silver) from the contact into the p-type base region or on the surface of the substrate backside. Shunts on the substrate backside are caused by poor definition of backside contacts such as waviness, and/or metal residue. Fourth, due to the relatively thin substrate thicknesses commonly used in solar cell applications, such as 200 micrometers and less, the act of screen printing the metal paste on the substrate surface can cause physical damage to the substrate. Lastly, silver-based paste is a relatively expensive material for forming conductive components of a solar cell.

One issue with the current method of forming metal interconnects using a screen printing process that utilizes a metal particle containing paste is that the process of forming the patterned features requires high temperature post-processing steps to densify the formed features and form a good electrical contact with the substrate surface. Due to the need to perform a high temperature sintering process the formed interconnect lines will have a high extrinsic stress created by the difference in thermal expansion of the substrate material and the metal lines. A high extrinsic stress, or even intrinsic stress, formed in the metal interconnect lines is an issue, since it can cause breakage of the formed metallized features, warping of the thin solar cell substrate, and/or delamination of the metallized features from the surface of the solar cell substrate. The high temperature post processing step can also cause the material in the solar cell device to diffuse into unwanted regions of the device, thus causing device problems, such as an electrical short. High temperature processes also limit the types of materials that can be used to form a solar cell due to the breakdown of certain materials at the high sintering temperatures. Also, screen printing processes also tend to be non-uniform, unreliable and often unrepeatable. Therefore, there is a need to form a low stress interconnect line that forms a strong bond to the surface of the substrate.

Another approach to forming very thin, robust current carrying metal lines on the surface of a solar cell substrate involves cutting grooves in the surface of the substrate with a laser. The grooves are subsequently filled by an electroless plating method. However the laser-cut grooves are a source of macro- and micro-defects. The laser-cut edge is not well defined, causing waviness on the finger edges, and the heat of the laser introduces defects into the silicon.

The effectiveness of a solar cell substrate fabrication process is often measured by two related and important factors, which are device yield and the cost of ownership (CoO). These factors are important since they directly affect the cost to produce an solar cell device and thus a device manufacturer's competitiveness in the market place. The CoO, while affected by a number of factors, is greatly affected by the system and chamber throughput or simply the number of substrates per hour processed using a desired processing sequence. A process sequence is generally defined as the sequence of device fabrication steps, or process recipe steps, completed in one or more processing chambers that are used to form a solar cell. A process sequence may generally contain various substrate (or wafer) fabrication processing steps. If the substrate throughput is not limited by the time to transfer the solar cell substrates then the longest process recipe step will generally limit the throughput of the processing sequence, increase the CoO and possibly make a desirable processing sequence impractical.

Therefore, there is a need for a system, a method and an apparatus that can process a substrate so that it can meet the required device performance goals and increase the system throughput and thus reduce the process sequence CoO. There is also a need for a low cost method of forming a contact structure for solar cells that have a low resistivity and clearly defined features.

SUMMARY OF THE INVENTION

Embodiments of the present invention generally provide an apparatus for forming a metal layer on a solar cell substrate, comprising a masking plate having a body, a first surface, a second surface and a plurality of apertures that extend through the body between the first surface and the second surface, a contact that is in communication with a first power supply, a thrust plate that is adapted to urge a metallized surface of a substrate against the contact and the first surface of the masking plate, an first electrode that is in electrical communication with the first power supply, wherein the first power supply is configured to electrically bias the first electrode relative to the contact, and an second electrode that is in electrical communication with a second power supply which is adapted to bias the second electrode relative to the contact or the first electrode.

Embodiments of the present invention may further provide an apparatus for forming a metal layer on a solar cell substrate, comprising a tank that has a processing region which is adapted to retain a volume of an electrolyte, an array of plating cells positioned in the processing region, wherein each plating cells in the array comprise a contact that is in communication with a power supply, a thrust plate that is adapted to urge a metallized surface of a substrate against the contact, and an electrode that is in electrical communication with a power supply.

Embodiments of the present invention may further provide an apparatus for forming a metal layer on a solar cell substrate, comprising a first tank that has a first processing region which is adapted to retain a volume of an electrolyte, a substrate holder assembly that is adapted hold two or more substrates, wherein the first substrate holder assembly comprises one or more contacts that is in electrical communication with a power supply, and a first actuator that is adapted to urge at least one of the one or more contacts against a metallized region formed on a surface of each of the two or more substrates to form an electrical connection, and a first electrode disposed in the first processing region of the first tank and is in electrical communication with a first power supply, wherein the first power supply is configured to electrically bias the first electrode relative to at least one of the one or more contacts.

Embodiments of the present invention may further provide an apparatus for forming a metal layer on a solar cell substrate, comprising a tank that has a processing region which is adapted to retain a volume of an electrolyte, a substrate holder assembly that is adapted hold one or more substrates, wherein the substrate holder assembly comprises one or more first contacts that are in electrical communication with a first power supply, one or more second contacts that are in electrical communication with a second power supply, and one or more actuators that are adapted to urge at least one of the one or more first contacts against a first metallized region formed on a first surface of each of the one or more substrates, and urge at least one of the one or more second contacts against a second metallized region formed on a second surface of each of the one or more substrates, a first electrode disposed in the processing region of the tank and is in electrical communication with a first power supply, wherein the first power supply is configured to electrically bias the first electrode relative to at least one of the one or more first contacts, and a second electrode disposed in the processing region of the tank and is in electrical communication with a second power supply, wherein the second power supply is configured to electrically bias the second electrode relative to at least one of the one or more second contacts.

Embodiments of the present invention may further provide an apparatus for forming a metal layer on a solar cell substrate, comprising a substrate holder assembly that is adapted hold one or more substrates, wherein the first substrate holder assembly comprises one or more contacts, and one or more actuators that are adapted to urge at least one of the one or more contacts against a metallized region formed on a surface of each of the one or more substrates to form an electrical connection, a first processing chamber assembly comprising a first tank that has a first processing region which is adapted to retain a volume of an electrolyte, and a first electrode disposed in the first processing region of the first tank and is in electrical communication with a first power supply, wherein the first power supply is configured to electrically bias the first electrode relative to at least one of the one or more contacts in the substrate holder when it is positioned in the first processing region of the first tank, a second processing chamber assembly comprising a second tank that has a second processing region which is adapted to retain a volume of an electrolyte, and a second electrode disposed in the second processing region of the second tank and is in electrical communication with a second power supply, wherein the second power supply is configured to electrically bias the second electrode relative to at least one of the one or more contacts in the substrate holder when it is positioned in the processing region of the second tank, and a robot that is adapted to position the substrate holder in the first and second processing regions.

Embodiments of the present invention may further provide an apparatus for forming a metal layer on a solar cell substrate, comprising a substrate holder assembly that is adapted hold one or more substrates, wherein the first substrate holder assembly comprises one or more contacts, and one or more actuators that are adapted to urge at least one of the one or more contacts against a metallized region formed on a surface of each of the one or more substrates to form an electrical connection, a tank that has a processing region which is adapted to retain a volume of an electrolyte, and a first electrode assembly disposed in the processing region of the tank, wherein the first electrode assembly comprises a first electrode that is in electrical communication with one or more power supplies, wherein one of the one or more power supplies is configured to electrically bias the first electrode relative to at least one of the one or more contacts in the substrate holder, and a second electrode that is in electrical communication with the one or more power supplies, wherein one of the one or more power supplies is configured to electrically bias the first electrode relative to at least one of the one or more contacts in the substrate holder, a second electrode assembly disposed in the processing region of the tank, wherein the second electrode assembly comprises a third electrode that is in electrical communication with the one or more power supplies, wherein one of the one or more power supplies is configured to electrically bias the third electrode relative to at least one of the one or more contacts in the substrate holder, and a fourth electrode that is in electrical communication with the one or more power supplies, wherein one of the one of the one or more power supplies is configured to electrically bias the fourth electrode relative to at least one of the one or more contacts in the substrate holder, and a robot that is adapted to position the substrate holder in the processing region.

Embodiments of the present invention may further provide a method of forming a metal layer on a solar cell substrate, comprising disposing a first masking plate having a plurality of apertures formed therein over at least a portion of a seed layer formed on a first substrate, disposing a second masking plate having a plurality of apertures formed therein over at least a portion of a seed layer formed on a second substrate, contacting the seed layer formed on the first substrate with a first electrical contact, contacting the seed layer formed on the second substrate with a second electrical contact, and forming a first metal layer over the seed layer formed on the first and second substrates by immersing the first and second substrates, a first electrode and a second electrode in a first electrolyte and biasing the first electrical contact relative to the first electrode and the second electrical contact relative to the second electrode, wherein the first metal layer is simultaneously formed on the first and second substrates within the areas exposed by apertures formed in the first and the second masking plates.

Embodiments of the present invention may further provide a method of forming a metal layer on a solar cell substrate, comprising disposing a first surface of a masking plate over at least a portion of a seed layer formed on a substrate, wherein the masking plate has a plurality of apertures that are in communication with a first surface of the masking plate, contacting the seed layer formed on the substrate with one or more electrical contacts, forming a first metal layer over the seed layer formed on the substrate by immersing the substrate and a first electrode in an electrolyte and biasing the one or more electrical contacts relative to the first electrode using one or more power supplies, wherein the first metal layer is simultaneously formed on the substrate within the areas exposed by apertures formed in the first masking plate, and biasing a second electrode that is disposed in the electrolyte relative to the one or more electrical contacts or the first electrode while forming the first metal layer to vary the uniformity of the deposited first metal layer. In one embodiment, a method can be used to plate between 2 and 1000 substrates at a time.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7A illustrates a side cross-sectional view of a batch electrochemical deposition chamber according to one embodiment described herein.

FIG. 7E illustrates an isometric view of a head assembly according to one embodiment described herein.

FIG. 7F illustrates a close-up isometric view of the head assembly illustrated in FIG. 7E according to one embodiment described herein.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a low cost solar cell using a novel high speed electroplating method and apparatus to form a metal contact structure having selectively formed metal lines using an electrochemical plating process. The apparatus and methods described herein remove the need to perform one or more high temperature screen printing processes to form conductive features on the surface of a solar cell substrate. Solar cell substrates that may benefit from the invention include substrates composed of single crystal silicon, multi-crystalline silicon, polycrystalline silicon, germanium (Ge), and gallium arsenide (GaAs), cadmium telluride (CdTe), cadmium sulfide (CdS), copper indium gallium selenide (CIGS), copper indium selenide ($CuInSe_2$), gallilium indium phosphide ($GaInP_2$), as well as heterojunction cells, such as GaInP/GaAs/Ge or ZnSe/GaAs/Ge substrates. The solar cell substrates may be formed in a square, rectangular, circular or any other desirable shape.

The resistance of interconnects formed in a solar cell device greatly affects the efficiency of the solar cell. It is thus desirable to form a solar cell device that has a low resistance connection that is reliable and cost effective. As noted above, silver (Ag) interconnecting lines formed from a silver paste is one of the currently the preferred interconnecting method. However, while silver has a lower resistivity (e.g., $1.59\times10^{-8}$ ohm-m) than other common metals such as copper (e.g., $1.7\times10^{-8}$ ohm-m) and aluminum (e.g., $2.82\times10^{-8}$ ohm-m) it costs orders of magnitude more than these other common metals. Therefore, one or more embodiments of the invention described herein are adapted to form a low cost and reliable interconnecting layer using an electrochemical plating process containing a common metal, such as copper. However, generally the electroplated portions of the interconnecting layer may contain a substantially pure metal or a metal alloy layer containing copper (Cu), silver (Ag), gold (Au), tin (Sn), cobalt (Co), nickel (Ni), zinc (Zn), lead (Pb), palladium (Pd), and/or aluminum (Al). Preferably, the electroplated portion of the interconnect layer contains substantially pure copper or a copper alloy.

Figure 2:
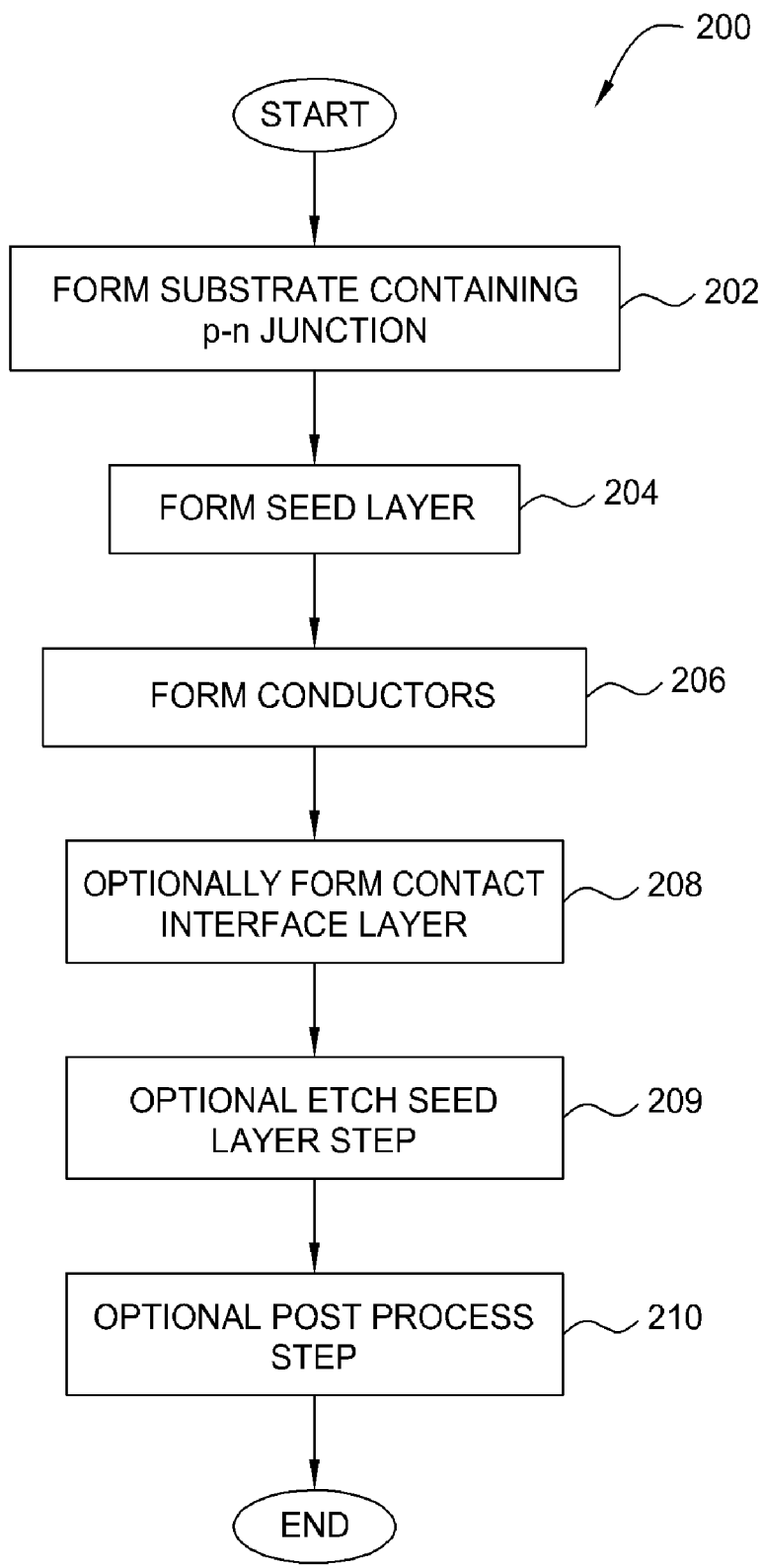
FIG. 2 illustrates a solar cell process sequence according to one embodiment described herein.

FIG. 2 illustrates a series of method steps 200 that are used to form metal contact structures on a solar cell device using the apparatus described herein. The processes described below may be used to form a solar cell having interconnects formed using any conventional device interconnection style or technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM or multilayer buried contact structures (both contacts on one side), may be formed using the apparatus and methods described herein without varying from the basic scope of the invention.

FIGS. 3A-3E illustrate the various states of a metallized substrate 320 after each step of method steps 200 has been performed. The method steps 200 start with step 202 in which a substrate 301 (FIG. 3A) is formed using conventional solar cell and/or semiconductor fabrication techniques. The substrate 301 may be formed from single crystal or polycrystalline silicon materials. Examples of these substrate fabrication process are the EFG process (Edge-defined Film-fed Growth) (e.g., U.S. Pat. No. 5,106,763), the RGS (Ribbon Growth on Substrate) process (e.g., U.S. Pat. No. 4,670,096, U.S. Pat. No. 5,298,109, DE 4,105,910 A1) and the SSP ribbon process (Silicon Sheets from Powder) (e.g., U.S. Pat. No. 5,336,335, U.S. Pat. No. 5,496,446, U.S. Pat. No. 6,111,191, and U.S. Pat. No. 6,207,891). In one example an n-type region 302 is disposed over the substrate 301 that has been doped with a p-type dopant. The n-type region 302 can be formed using conventional chemical vapor deposition (CVD) process, by driving-in an n-type dopant using a diffusion furnace, or other similar doping or film deposition techniques. The formed p-n junction will form a p-n junction region 303. An arc layer 311, or antireflective coating, can be formed on the light-receiving surface 329 using a physical vapor deposition (PVD) or CVD technique. In one case, an aperture 312 is formed in the arc layer 311 so that a metal line can directly contact the n-type region 302. The apertures 312, as shown may formed in the arc layer 311 formed using a conventional lithography and wet or dry etching semiconductor processing techniques or by use of conventional laser drilling processes.

Figure 3A:
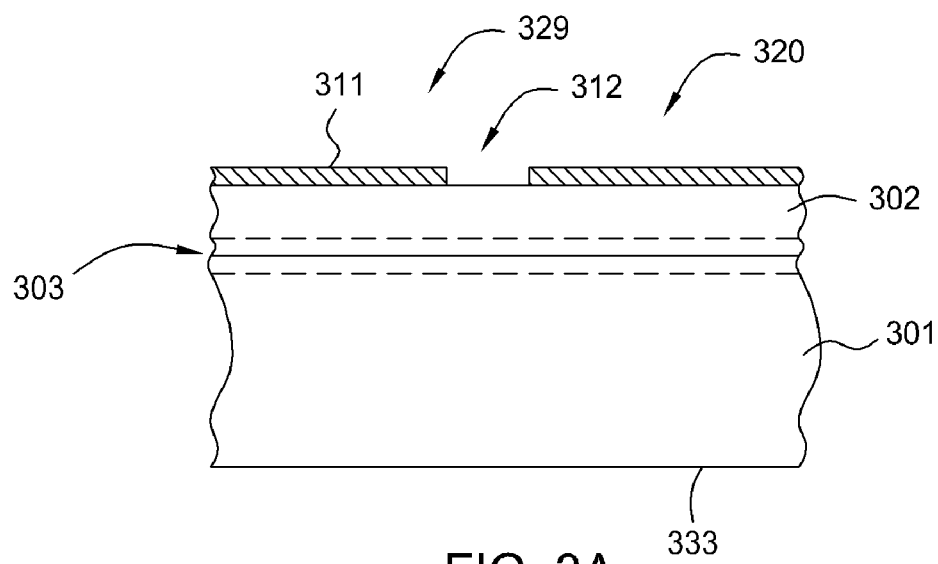
FIGS. 3A-3F illustrate schematic cross-sectional views of a solar cell during different stages of the process sequence described in FIG. 2.
Figure 3B:
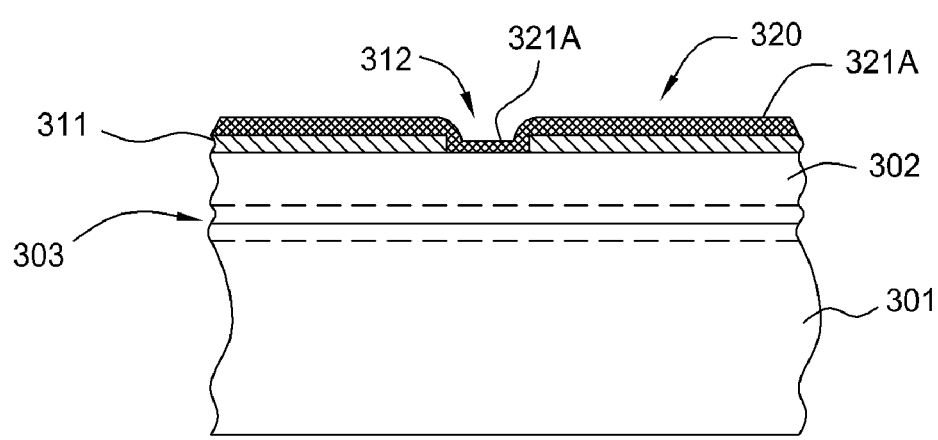
Figure 3C:
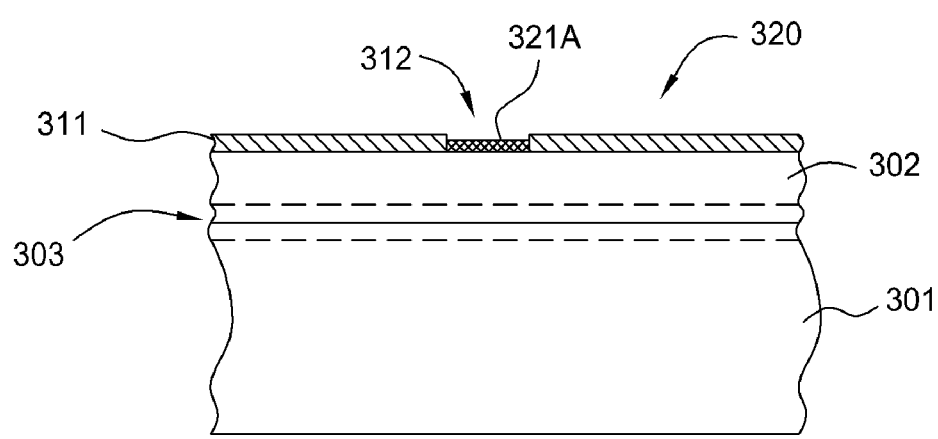

In the next step, step 204, as shown in FIG. 3C, a seed layer 321 is formed over desired regions of the substrate surface using a conventional selective deposition process, such as an electroless or selective CVD deposition process. An example of electroless deposition process that may be used to grow a seed layer 321 on a doped silicon region is further described in the U.S. patent application Ser. No. 11/385,047, filed Mar. 20, 2006, U.S. patent application Ser. No. 11/385,043, filed Mar. 20, 2006, and U.S. patent application Ser. No. 11/385,041, filed Mar. 20, 2006, which are all incorporated by reference in their entirety. In another embodiment, the seed layer 321 may be selectively formed by use of an inkjet, rubber stamping, or any technique for the pattern wise deposition (i.e., printing) of a metal containing liquid or colloidal media on the surface of the substrate. After depositing the metal containing liquid or colloidal media on the surface of the substrate it is generally desirable to subsequently perform a thermal post treatment to remove any solvent and promote adhesion of the metal to the substrate surface. An example of pattern wise deposition process that may be used to form a seed layer 321 on a region of a substrate is further described in the U.S. patent application Ser. No. 11/530,003, filed Sep. 07, 2006, which is incorporated by reference in its entirety.

In one embodiment, as shown in FIGS. 3B and 3C, the seed layer 321 is formed from a blanket seed layer 321A (FIG. 3B), that is deposited over the complete surface of the substrate and then selective regions are removed using conventional masking and etching techniques to form the seed layer 321 (FIG. 3C) that has a desired pattern on the surface of the substrate. In general, a blanket seed layer 321A may be deposited using a physical vapor deposition (PVD), chemical vapor deposition (CVD), molecular beam epitaxy (MBE), or atomic layer deposition (ALD) process.

In general, the seed layer 321 may contain a pure metal, metal alloy or other conductive material. In one embodiment, the seed layer 321 contains one or more metals selected from the group consisting of nickel (Ni), cobalt (Co), titanium (Ti), tantalum (Ta), rhenium (Rh), molybdenum (Mo), tungsten (W), and ruthenium (Ru). It is desirable to select a deposition process and a metal that forms a good electrical contact, or ohmic contact, between the doped silicon region (e.g., n-type region 302) and the deposited seed layer 321. In one aspect, the seed layer 321 is selected so that it acts as a barrier to the diffusion of a metal in the subsequently formed conductor 325 during subsequent processing steps. For example, the seed layer 321 may contain one or more metals or metal alloys selected from the group consisting of nickel (Ni), cobalt (Co), titanium (Ti), their silicides, titanium tungsten (TiW), titanium nitride (TiN), tantalum (Ta), tantalum nitride (TaN), molybdenum (Mo), tungsten (W), tungsten silicide (WSi), molybdenum silicide (MoSi), and ruthenium (Ru). In one embodiment, the thickness of the seed layer 321 may be between about 0.1 micrometers (μm) and about 1 μm.

Figure 3D:
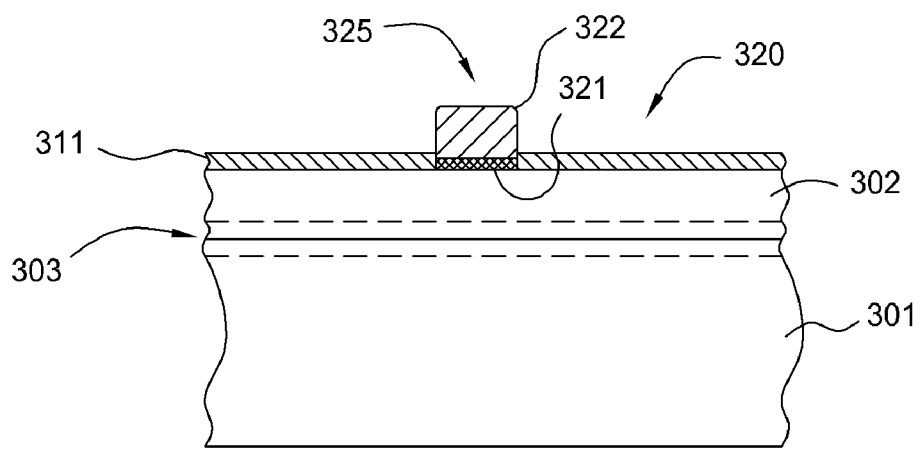

In one embodiment, the seed layer 321 consists of at least two layers of metal that are used to promote adhesion to the surface of the substrate, act as a diffusion barrier, and/or promote the growth of a subsequently deposited metal layer 322 contained within the conductor 325 (FIG. 3D). In one example, the seed layer 321 contains a first metal layer that is deposited on the substrate surface(s) and a second metal layer that contains copper. In this configuration the second layer is deposited over the first metal layer so that it can act as a seed on which an electrochemically deposited layer can be formed. In this case the first layer may contain one or more metals or metal alloys selected from the group consisting of nickel (Ni), cobalt (Co), titanium (Ti), titanium nitride (TiN), titanium tungsten (TiW), tantalum (Ta), tantalum nitride (TaN), molybdenum (Mo), tungsten (W), and ruthenium (Ru) that is deposited using an electroless deposition process, a conventional physical vapor deposition (PVD) process or a conventional chemical vapor deposition (CVD) process, and a second copper containing layer may be a substantially pure layer or an alloy that contains one or more metals selected from the group consisting of cobalt (Co), tin (Sn), silver (Ag), gold (Au), aluminum (Al), and nickel (Ni). In one embodiment, the second layer may be deposited using an electroless deposition process, a conventional physical vapor deposition (PVD) process or a conventional chemical vapor deposition (CVD) process.

Metal Fill/Metal Layer formation Process(es)

Figure 1A:
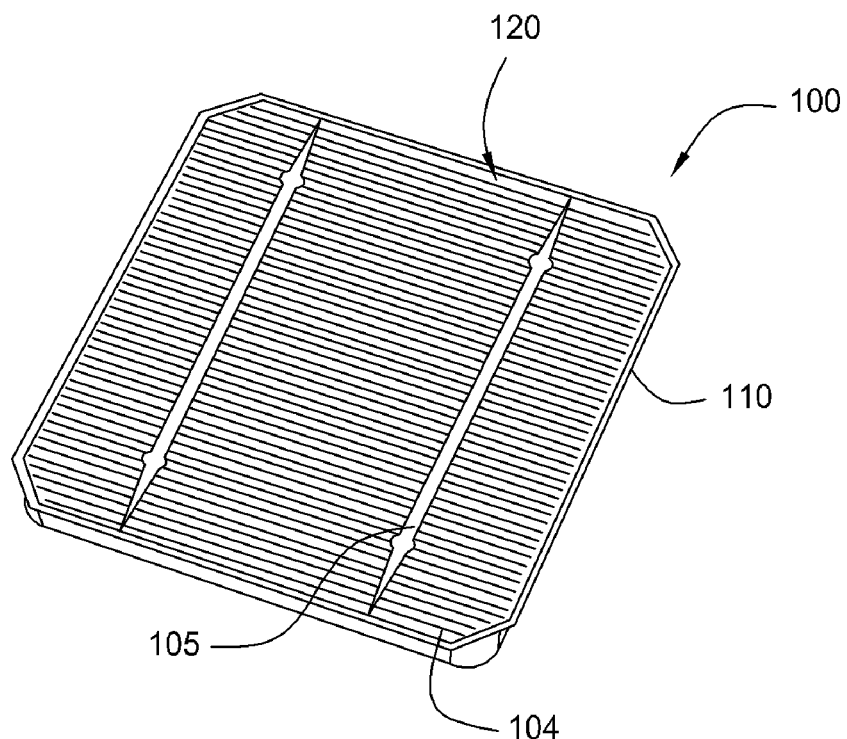
FIG. 1A illustrates an isometric view of prior art solar cell containing a front side metallization interconnect pattern.
Figure 1B:
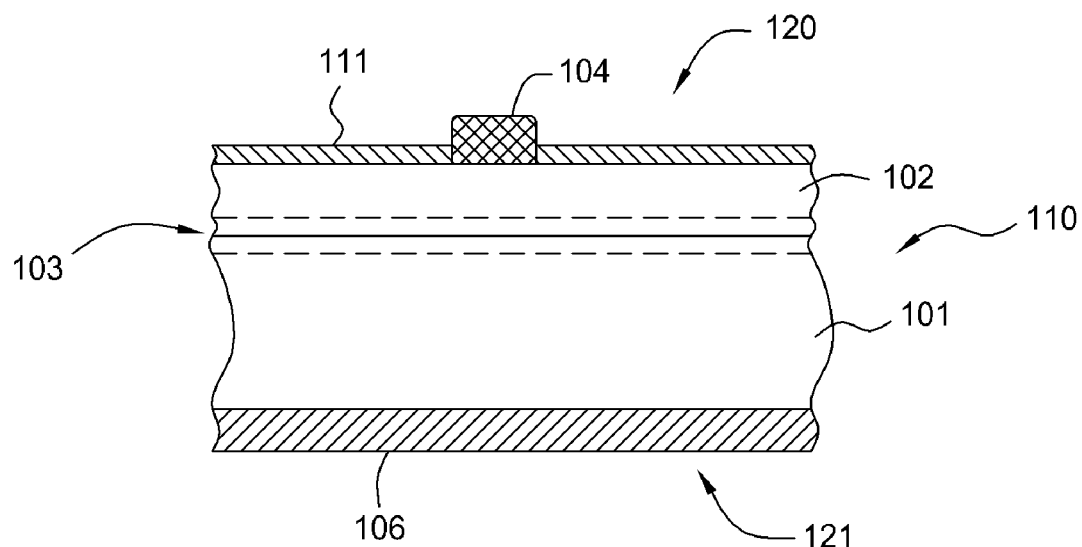
FIG. 1B illustrates a cross-sectional side view of a prior art solar cell shown in FIG. 1A.
Figure 1C:
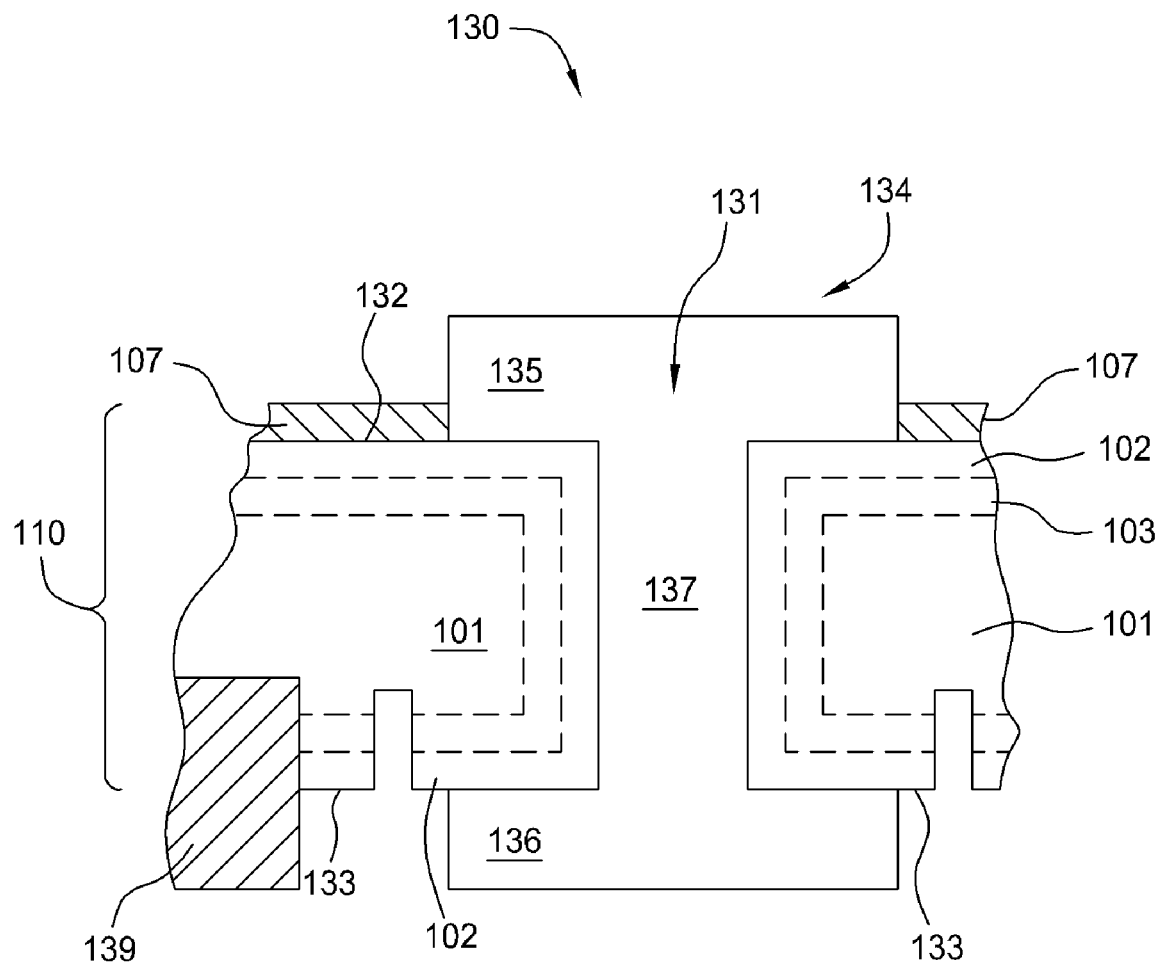
FIG. 1C illustrates a cross-sectional view of a prior art PUM type device.
Figure 1D:
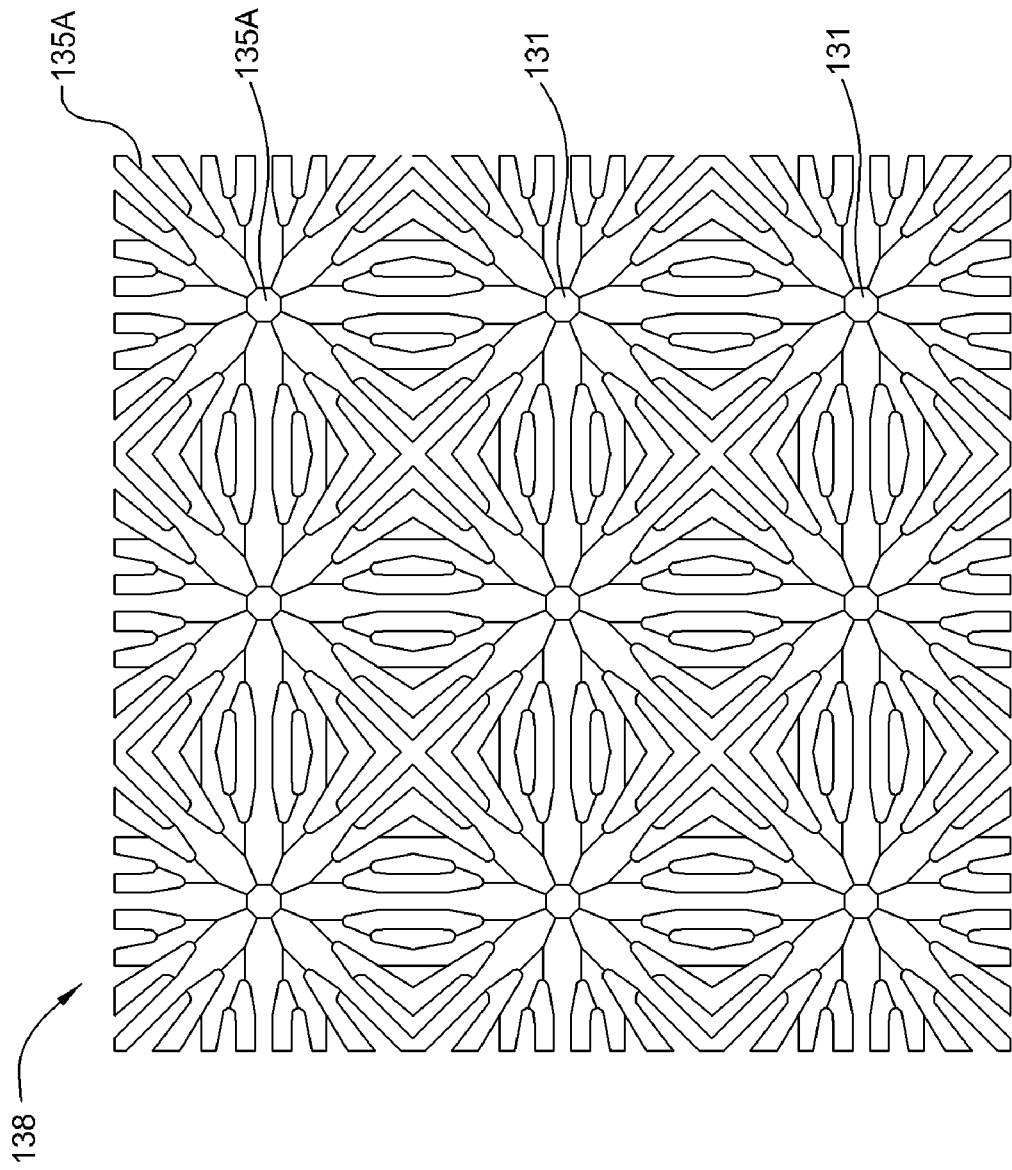
FIG. 1D illustrates a plan view of a top contact structure of a PUM cell, wherein the finger width and geometry have been optimized to maximize cell efficiency.
Figure 4A:
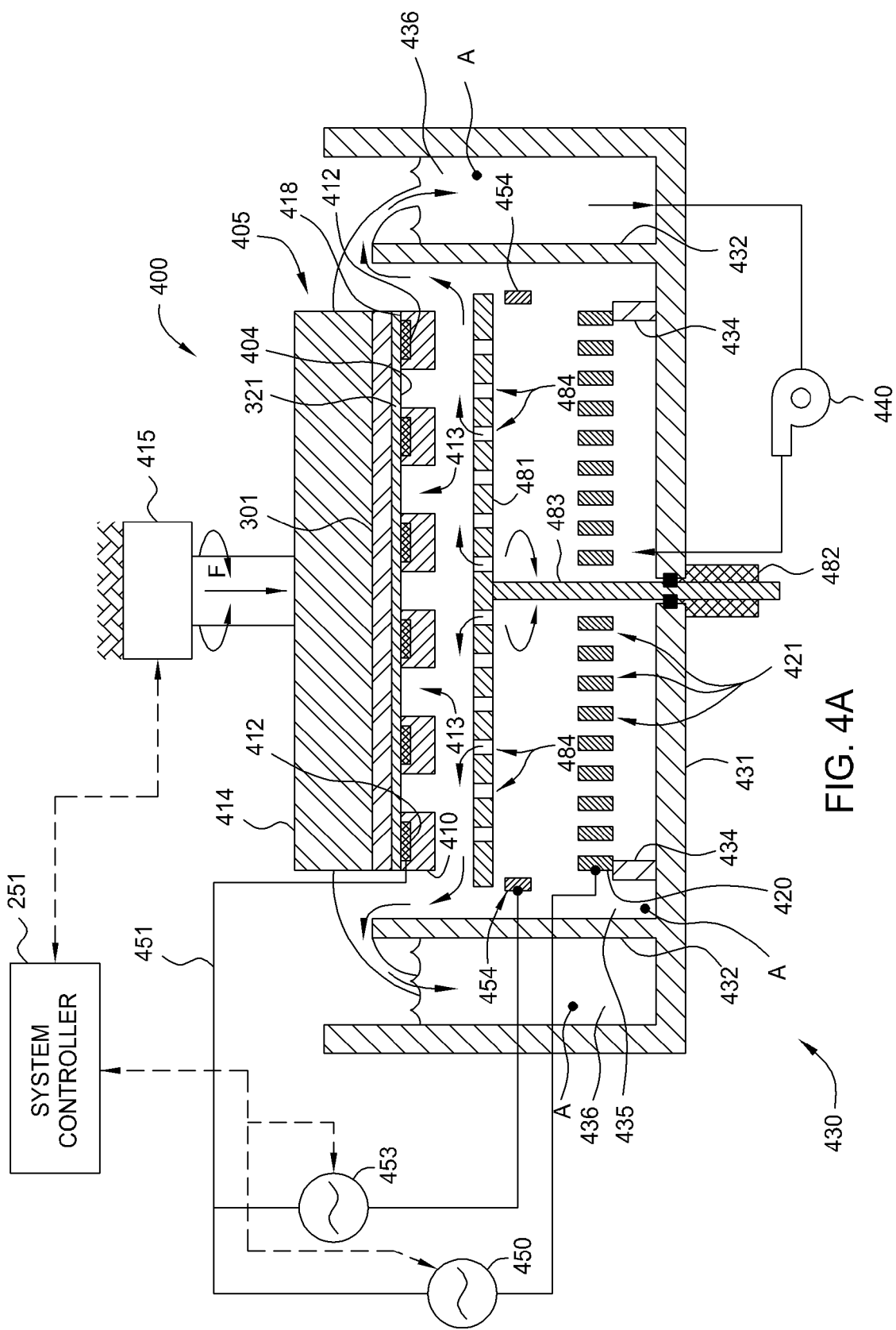
FIG. 4A illustrates a side cross-sectional view of an electrochemical processing chamber according to one embodiment described herein.

Referring to FIGS. 2, 3D and 4A, in step 206 the conductor 325 elements are electrochemically deposited over desired regions of the seed layer 321 using a masking plate 410 that contains apertures 413 that preferentially allow the electrochemically deposited material to form therein. In this process step, the seed layer 321 is cathodically biased relative to an electrode 220 using a power supply 250, which causes the ions in an electrolyte to form a metal layer 322 on the exposed areas of the seed layer 321 created within the apertures 413. In one embodiment, the light-receiving side of the solar cell may have a metal pattern similar to the pattern shown in FIG. 1D, which is discussed above.

FIGS. 4A-4D are cross-sectional views that illustrate various embodiments of a single substrate type electrochemical plating cell 400 that may be used to electrochemically deposit a metal layer on the seed layer 321 during step 206. While FIGS. 4A-4D illustrate the substrate in a face-down configuration (e.g., seed layer 321 is facing down) this configuration is not intended to be limiting as to the scope of the invention, since the electrochemical plating cell 400 can be in any desirable orientation, such as face-up, vertically oriented or oriented at some desired angle relative to the horizontal without varying from the scope of the invention.

Generally, the electrochemical plating cell 400 generally contains a head assembly 405, an electrode 420, a power supply 450 and a plating cell 430. The head assembly 405 may contain a thrust plate 414 and a masking plate 410 that is adapted to hold a metallized substrate 320 in a position relative to the electrode 420 during the electrochemical deposition. In one aspect, an actuator 415 is used to urge the thrust plate 414 and metallized substrate 320 against electrical contacts 412 so that an electrical connection can be formed between a seed layer 321 formed on the surface of the metallized substrate 320 and the power supply 450 through the lead 451. It should be noted that in some embodiments of the invention, a masking plate 410 need not used. In this case, a masking material can be used to allow a metal to be selectively formed on desired regions of the substrate surface. A typical masking material may be a photoresist material that is patterned by conventional techniques.

In one embodiment, as shown in FIG. 4A, the electrical contacts 412 are formed on a surface of the masking plate 410. In another embodiment, the electrical contacts 412 may be formed from separate and discrete conductive contacts (not shown), such as conventional conductive clips or conductive pins, that are nested within a recess formed in the masking plate 410 when the metallized substrate is being urged against the masking plate 410. The electrical contacts (e.g., contacts 412) may be formed from a metal, such as platinum, gold, or nickel, or another conductive material, such as graphite, copper Cu, phosphorous doped copper (CuP), and platinum coated titanium (Pt/Ti). The masking plate 410 is generally made of a dielectric material that has a plurality of apertures 413 formed therein that allow the electrolyte "A" to contact exposed regions on the substrate surface (e.g., exposed region 404). This configuration thus allows the preferential formation of an electrochemically deposited metal layer in the exposed regions 404 on the processing surface of the substrate when a cathodic bias of a sufficient magnitude is applied to the seed layer 321. In one embodiment, the masking plate 410 is made of glass, a plastic material, and/or a ceramic material that contains a plurality of apertures 413 that are formed in the masking plate 410 using conventional machining operations, such as laser cutting, milling, water-jet cutting, drilling, electro-discharge machining (EDM), wet etch, plasma etch, or stamping processes. In one embodiment, the masking plate 410 may be formed from $SiO_2$, polyimide, quartz, or other ceramic, plastic, glass, or polymeric material, for example. In one embodiment, the surface of the masking plate 410 that is in contact with the processing surface of the substrate contains a compliant material that is adapted to compensate for surface topography on the substrate surface and/or more actively prevent plating of on these covered surfaces. Complaint materials may include polymeric materials (e.g., rubber materials) and polymeric materials that will not be chemically attacked by the electrolyte. The compliant materials may be soft enough to take-up variations in the topography of the substrate surface.

The plating cell 430 generally contains a cell body 431 and an electrode 420. The cell body 431 comprises a plating region 435 and an electrolyte collection region 436 that contains an electrolyte (e.g., item "A") that is used to electrochemically deposit the metal layer on the substrate surface. In one aspect, the electrode 420 is positioned in the lower portion of the plating region 435 and rests on, or is supported by, the features 434 formed in the cell body 431. In general, it is desirable to increase the surface area of the anode so that high current densities can applied to the electrode 420 relative to the seed layer 321 to increase the plating rate. It is believed that reducing the current density by increasing the surface area of the anode is useful to reduce metal particle formation in the electrolyte that are often created when plating at high current densities using a consumable electrode. The metal particles are likely formed due to the high concentration of the metal ions near the anode surface during the high current density plating process. The reduction of particles will reduce the number of plating defects found in the formed electroplated layer, thus reducing the substrate scrap and improving the CoO of the electrochemical deposition process. In one embodiment, as shown in FIGS. 4A-4D, the electrode 420 is formed in a high-aspect-ratio configuration, which maximizes the surface of the electrode 420 to reduce the current density during the deposition process. In this configuration, the electrode 420 may be formed in spiral shape to maximize the surface area of electrode 420. The electrode 420 may have a plurality of holes, slots, or other features (e.g., item #421) that allow fluid to pass therethrough and increase the surface area of the electrode. In one aspect, the surface area of the electrode 420 is greater than about 2 to 10 times of the surface area of the cathode, or area of the metal is plated on the substrate surface. However, a spiral shape is not intended to be limiting as to the scope of the invention, since any high surface area shape could be used herein, for example a wire mesh structure. The electrode 420 can be formed so that it has a desired shape, such as square, rectangular, circular or oval. The electrode 420 may be formed from material that is consumable (e.g., copper) during the electroplating reaction, but is more preferably formed from a non-consumable material. A non-consumable electrode may be made of a conductive material that is not etched during the formation the metal layer 332, such as titanium coated copper, platinum coated copper, platinum coated titanium, or ruthenium coated titanium. In another embodiment, the plating apparatus, chamber and plating cell may also utilize a conveyor type design that continuously plate a number of substrates at one time, for example, between 25 and 1000 substrates. The substrates in any of the processes described herein may be oriented in a horizontal, vertical or angled orientation relative to the horizontal during step 206.

In an effort to achieve high plating rates and achieve desirable plated film properties, it is often desirable to increase the concentration metal ions near the cathode (e.g., seed layer 321 surface) by reducing the diffusion boundary layer or by increasing the metal ion concentration in electrolyte bath. It should be noted that the diffusion boundary layer is strongly related to the hydrodynamic boundary layer. If the metal ion concentration is too low and/or the diffusion boundary layer is too large at a desired plating rate the limiting current ($i_L$) will be reached. The diffusion limited plating process created when the limiting current is reached, prevents the increase in plating rate by the application of more power (e.g., voltage) to the cathode (e.g., metallized substrate surface). When the limiting current is reached a poor quality low density film is produced due to the dendritic type film growth that occurs due to the mass transport limited process. In general the hydrodynamic and diffusion boundary layers can be improved from a static flow case by directing a flow of the electrolyte to the metallized substrate surface during plating. In operation it is thus desirable to pump an electrolyte "A" from the electrolyte collection region 436 and then past the apertures 413 formed in the masking plate 410 to improve the diffusion boundary layer.

Referring to FIG. 4A, the pump 440 may be adapted to deliver the electrolyte from the collection region 436 across the electrode 420 and exposed region 404 and then over a weir 432 separating the plating region 435 and then back into the electrolyte collection region 436. Referring to FIG. 4D, in one embodiment, the pump 440 is adapted to deliver the electrolyte in a tangential path across the metallized substrate 320 from a nozzle 437. In this configuration the pump 440 is adapted to move the electrolyte from the collection region 436 and then across the exposed region 404 and then over a weir 432 separating the plating region 435 and then back into the electrolyte collection region 436. The fluid motion created by the pump 440 in either configuration allows the replenishment of the electrolyte components at the exposed region 404 that is exposed at one end of the apertures 413. In one embodiment, to reduce the diffusion boundary layer it is desirable to rotate and/or move the metallized substrate 320 and head assembly 405 relative to the electrode 420 during step 206 by use of the actuator 415.

Moreover, it may be further desirable to reduce the diffusion boundary layer and hydrodynamic boundary layer at the metallized substrate surface (cathode) by use of a mechanical actuator or other similar device. In one embodiment, the electrochemical plating cell 400 also contains a diffusion plate 481 that is adapted to agitate the fluid near the metallized substrate surface. In one embodiment, the diffusion plate 481 is adapted to be move during the plating process by use of coupling shaft 483 and an actuator 482. The moving diffusion plate 481 imparts motion to the electrolyte near the metallized substrate surface, which will reduce the diffusion boundary layer. In one aspect, the diffusion plate 481 contains a plurality protrusions 485 (e.g., bumps, vanes) on the surface of the diffusion plate 481 to improve the fluid motion across the metallized substrate surface as the diffusion plate 481 is rotated. In cases where the diffusion plate 481 is rotated it may be desirable to use a circular shaped diffusion plate 481 (FIG. 4C) rather than the rectangular shape shown in FIG. 4B. In one embodiment, the actuator 482 is adapted to impart a vibrational motion to the diffuser plate 481 to help improve the diffusion boundary layer at the surface of the metallized substrate. The diffusion plate 481 may have a plurality of holes 484 or pores that can be used to control and direct the flow of electrolyte towards the metallized substrate surface. In one embodiment, the diffusion plate 481 is formed from a porous plastic or porous ceramic material.

In one embodiment, the fluid motion is achieved by the delivery of the electrolyte through a plurality of fluid jets that are oriented towards the metallized substrate surface, such as two or more of the nozzles (e.g., nozzle 437 in FIG. 4D; only a single nozzle 437 is shown). In another embodiment, fluid motion is provided by the use of gas jets that deliver a gas into the solution that creates fluid movement due to the vertical motion of the injected gas bubbles due to the buoyancy of the gas in the electrolyte.

Referring to FIG. 4D, in one embodiment, a dosing system 460 may be used in conjunction with the system controller 251 to control the concentration of the various chemicals found in the electrolyte over time. The dosing system 460 generally includes one or more fluid delivery sources (e.g., reference numerals 461, 462), a chemical analysis system 465 and a waste delivery system 464. The waste delivery system 464 is adapted to remove a portion of the electrolyte from the plating cell 430 and deliver it to a waste collection system 463. The fluid sources 461, 462 are generally configured to deliver one or more of the chemicals to the electrolyte in the plating cell 430. In one embodiment, the fluid source 461 is adapted to deliver a powder (e.g., copper oxide powder) or metal ion containing solution (e.g., copper sulfate) to the electrolyte to replenish the metal ion concentration plated out during step 206 or step 208 when an inert anode is used. In one embodiment, the fluid sources 461, 462 are adapted to deliver one or more of the chemicals found in the electrolyte that are discussed in conjunction with steps 206 or 208. The chemical analysis system 465 may be an organic (e.g., Raman spectroscopy, CVS) and/or an inorganic chemical analyzer that are used to measure the properties and concentrations of the chemicals in the electrolyte solution at a desired time. Therefore, by use of the system controller 251, the fluid sources 461, 462, the waste delivery system 464, and the chemical analyzer 465, which can feed back the measured results to the system controller 251, the chemical concentrations in the electrolyte can be controlled as a function of time. In some example, the dosing system 460 may be used to perform a conventional "feed and bleed" type chemicals replenishment system.

Referring to FIGS. 4A and 4D, in one embodiment, an auxiliary electrode 454 is placed in a desirable position within the plating cell 430 to shape the electric field during the plating process and thus optimize the deposition uniformity of the deposited metal layer 322. At high plating rates the electric field, which is created between the biased seed layer 321 relative to the electrode 420, may have significant non-uniformities due to the non-optimal geometric and fluid dynamic characteristics of the plating cell that can be compensated for by use of the auxiliary electrode 454. In one embodiment, as shown in FIGS. 4A and 4D, an auxiliary electrode 454 is positioned within plating region 435 below the diffuser plate 481. In another embodiment, the auxiliary electrode 454 is disposed within the electrolyte collection region 436 and thus is in electrical communication with the plating region 435 through the electrolyte flowing over the weir 432. In some cases it may be desirable to place the auxiliary electrode 454 above the diffuser plate 481 and closer to the substrate surface. The auxiliary electrode 454 can be separately biased using a second power supply 453 that is controlled by the system controller 251. An example of an exemplary auxiliary electrode design is further described in the commonly assigned U.S. patent application Ser. No. 11/362,432, filed Feb. 24, 2006, which is herein incorporated by reference.

Figure 4B:
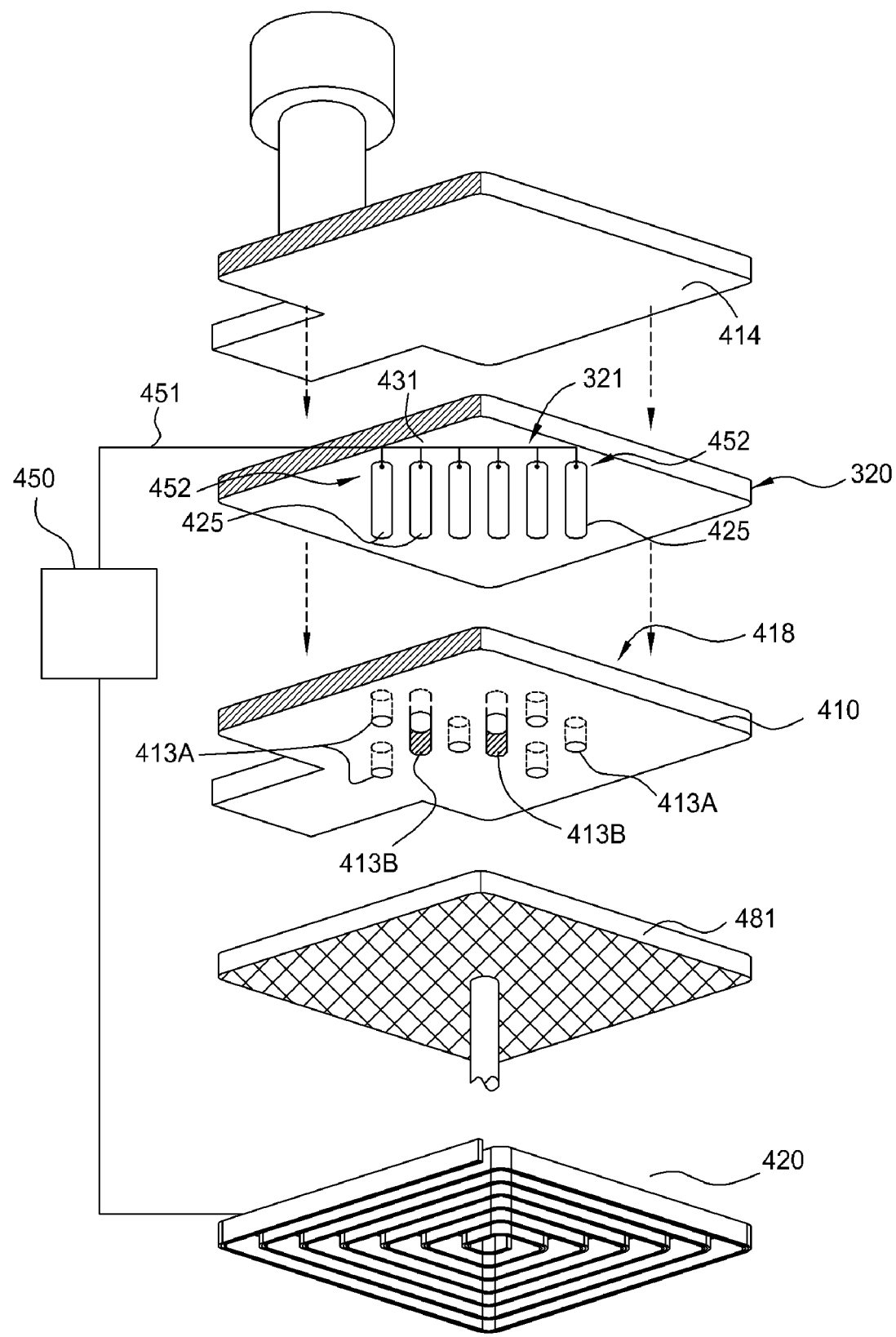
FIG. 4B illustrates is an isometric view of various electrochemical processing chamber components according to one embodiment described herein.

FIG. 4B illustrates an exploded isometric view of the head assembly 405, metallized substrate 320, diffusion plate 481 and electrode 420 portion of the electrochemical plating cell 400. While the metallized substrate 320 and plating cell 430 components illustrated in FIG. 4B have a square shape, this configuration is not intended to limiting to scope of the invention. When in use the metallized substrate 320 is placed in contact with the masking plate 410 so that features 426 (FIG. 5A) can be formed on the exposed regions of the patterned features 425 of the seed layer 321 through the apertures (e.g., apertures 413A, 413B) formed in the masking plate 410. The patterned features 425 are metallized regions of the seed layer 321 that have been deposited or formed in a desired pattern on the surface 429 of the metallized substrate 320. It should be noted that the apertures 413 formed in the masking plate 410 may be formed in any desirable shape and/or pattern. In one embodiment, the apertures 413 formed in the masking plate 410 may be a rectangular or a circular feature that is between about 100 μm and about 240 μm in size. In another embodiment, the apertures formed in the masking plate 410 may be a pattern features, for example grid lines or interdigitated grid lines that are between about 100 μm and about 240 μm wide and have a length that extends across the substrate surface, such as between about 100 μm and the length of the substrate in length. In one embodiment, the total exposed area on the surface of the substrate, which is the sum of all of the cross-sectional areas of all of the apertures 413 at the contacting surface 418 of the masking plate 410, is between about 0.5% and about 100% of the surface area of the surface of the substrate that is in contact with the masking plate 410. In one embodiment, the total exposed area of the apertures that are in contact with the non-light-receiving surface, or backside, of the substrate is greater than about 70% of the surface area of the non-light-receiving surface of the substrate. In one embodiment, the total exposed area of the apertures that are in contact with the light-receiving surface of the substrate is less than about 30% of the surface area of the light-receiving surface of the substrate. Preferably, the total exposed area of the apertures that are in contact with the light-receiving surface of the substrate is less than about 10%. In general, the masking plate 410 must be thicker than the maximum electrochemical deposition thickness to allow the masking plate to be separated from the substrate after the deposition process has been performed. Typically, the masking plate may be between about 100 µm and about 1 cm thick.

Figure 4C:
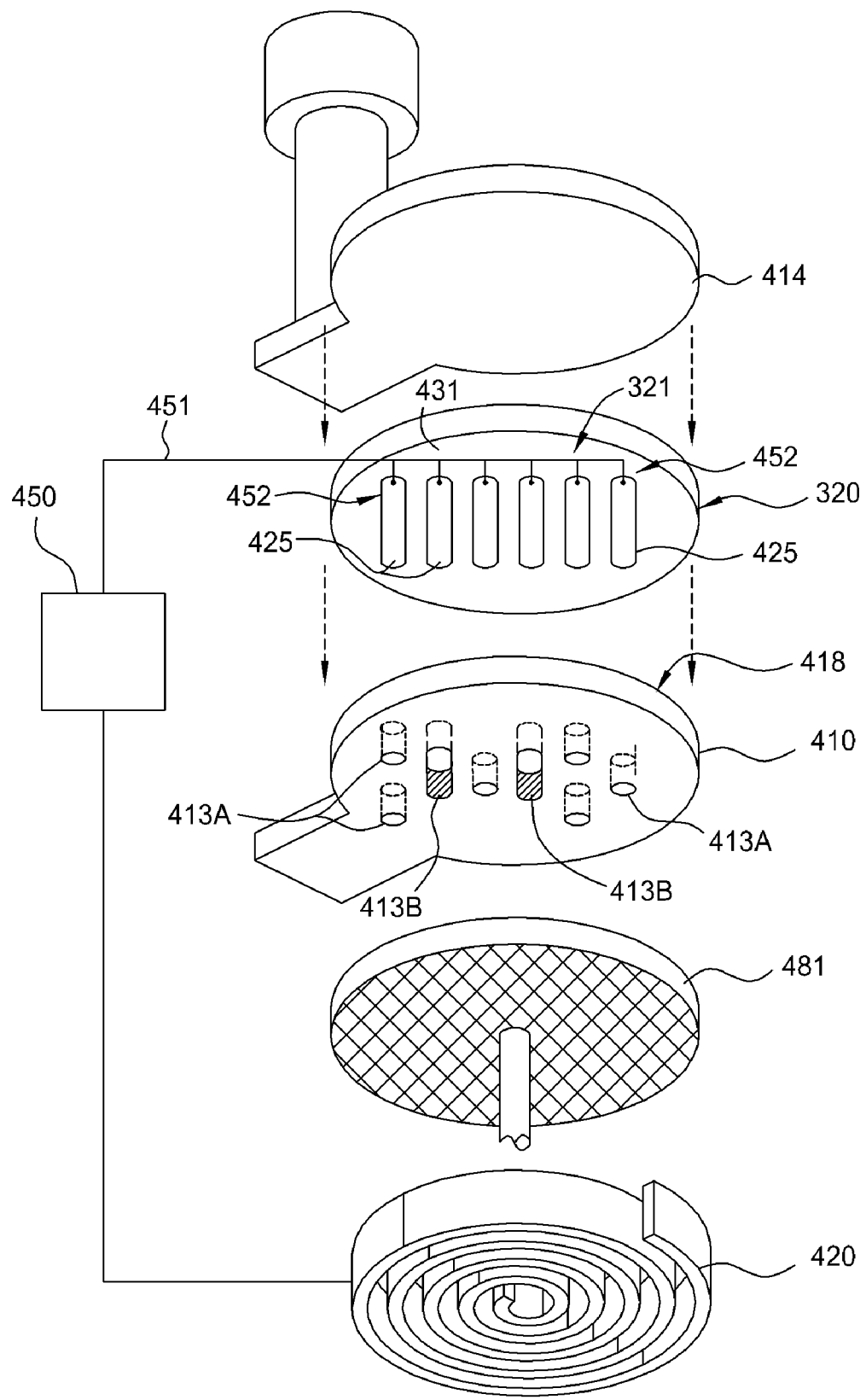
FIG. 4C illustrates is an isometric view of various electrochemical processing chamber components according to one embodiment described herein.
Figure 4D:
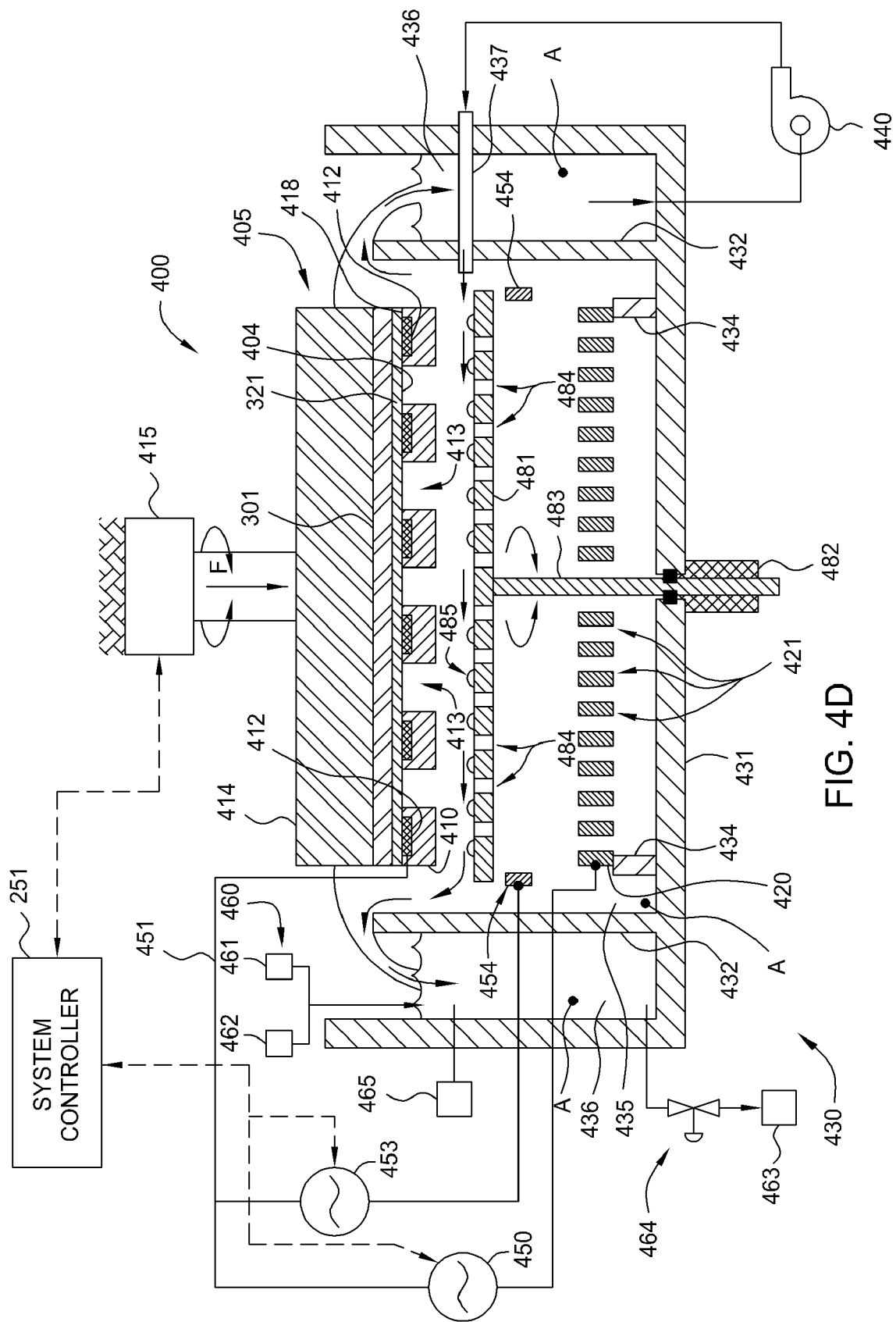
FIG. 4D illustrates a side cross-sectional view of an electrochemical processing chamber according to one embodiment described herein.

FIG. 4C is an exploded isometric view of the head assembly 405, metallized substrate 320, diffusion plate 481 and electrode 420 portion of the electrochemical plating cell 400 according to another embodiment of the invention. FIG. 4C is similar to FIG. 4B except that the metallized substrate 320 and plating cell 430 components have a circular shape. This configuration may be useful where the metallized substrate 320 has a circular shape and/or it is desirable to rotate one or more of the components, such as the head assembly 405, metallized substrate 320, diffusion plate 481 and/or electrode 420.

Figure 5A:
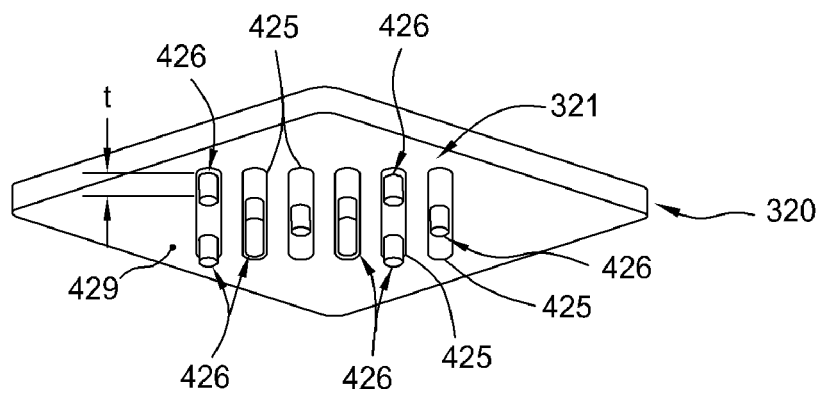
FIGS. 5A-5F illustrate an isometric view of a substrate having an electrochemically deposited layer formed thereon according to one embodiment described herein.
Figure 5B:
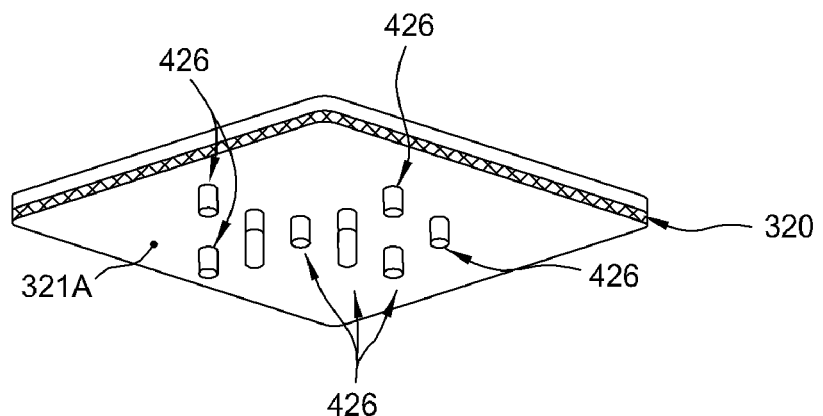
Figure 5C:
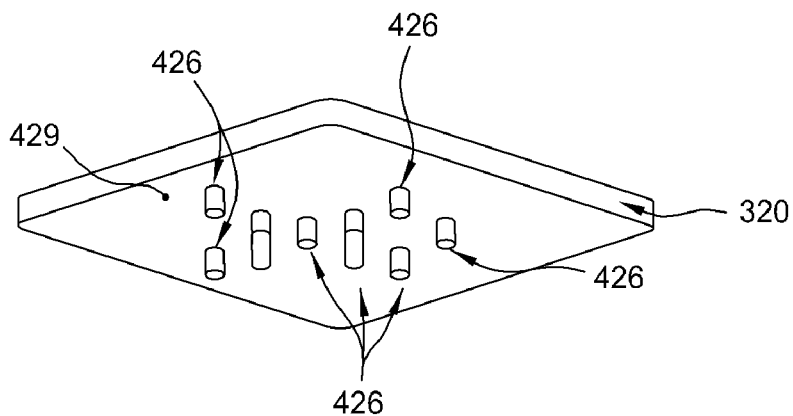
Figure 5D:
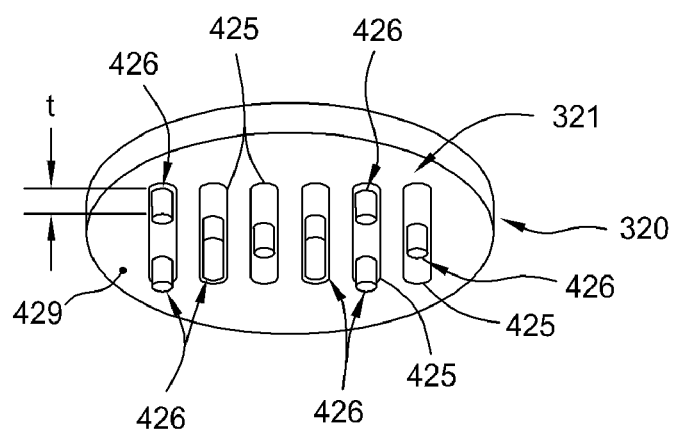

FIGS. 5A and 5D are isometric views of a square and a circular metallized substrate 320 that contains a plurality of features 426 formed on certain regions of the patterned features 425 after step 206 has been performed. Referring to FIGS. 5 and 6A, in one example a group of circular apertures 413A and slot shaped apertures 413B formed in the masking plate 410 are aligned to the patterned features 425 of the seed layer 321 so that features 426 having a desirable shape and thickness "t" (FIG. 5A and 5D) can be preferentially formed thereon. The features 426 are formed by cathodically biasing the patterned features 425 using the power supply 450 and the contact(s) 452 so that the metal layer 322 can be grown to a desired thickness. The thickness "t" of the features 426 that form the conductor 325 may be between about 20 µm and about 40 µm on the non-light-receiving side of the substrate and between about 1 µm to about 5 µm on the light-receiving surface of the substrate, which is hard to accomplish using conventional electroless, PVD and CVD techniques at an acceptable substrate throughput and/or desirable deposition thickness uniformity. Further, for high power solar cell applications the conductor 325 thickness on the non-light-receiving side of the substrate may be between about 40 and about 70 µm, and on the light receiving side of the substrate the thickness may be between about 1 and about 20 µm thick.

Figure 5E:
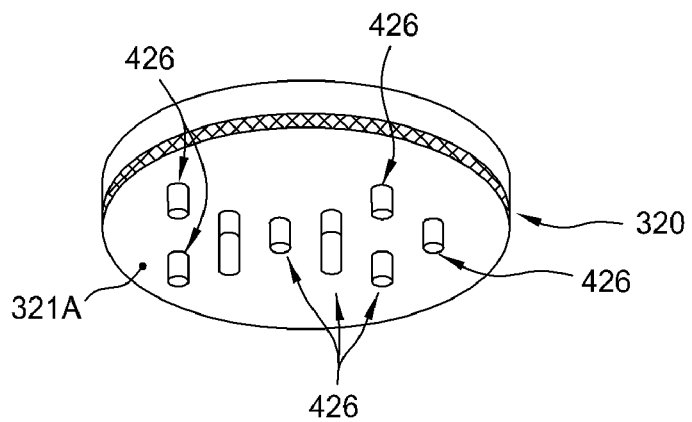

FIGS. 5B and 5E are isometric views of a square and a circular metallized substrate 320 that contains a plurality of features 426 formed on a blanket seed layer 321A formed after performing step 206 of the method steps 200. In this case, a group of features 426 formed on selected areas of the blanket film 321A that have a shape defined by the apertures (e.g., apertures 413A, 413B) and a thickness "t" set by the deposition rate and deposition time of electrochemical deposition process performed in step 206. The features 426 may be formed on desirable regions of the blanket film 321A by aligning the masking plate 410 to the metallized substrate 320.

Figure 5F:
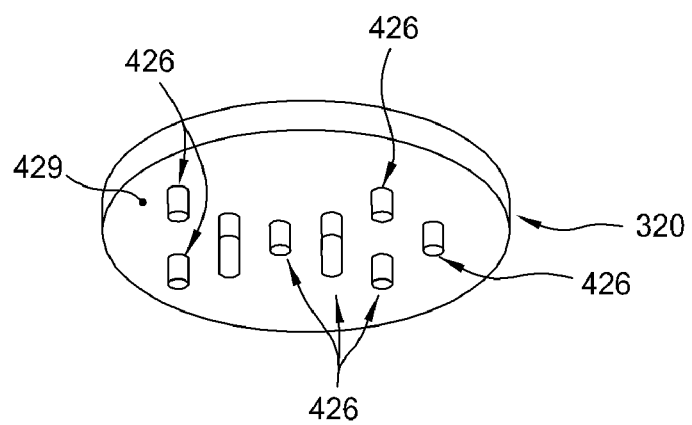

FIGS. 5C and 5F are isometric views of a metallized substrate 320 that contains only the plurality of features 426 formed on the surface 429 of the metallized substrate 320 after an optional metal layer removal step is performed. The optional metal layer removal step generally entails performing a conventional wet or dry etching step to remove any unwanted and/or excess metal on the surface 429 of the substrate, such as unused portions of the blanket seed layer 321A (FIGS. 5B or 5E) or unused portions of the patterned features 425 (FIGS. 5A or 5D). Conventional wet etching steps may use an acid or basic solution that is adapted to remove the unwanted and/or excess metal on the surface 429.

The system controller 251 is adapted to control the various components used to complete the electrochemical process performed in the electrochemical plating cell 400. The system controller 251 is generally designed to facilitate the control and automation of the overall process chamber and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the electrochemical plating cell processes (e.g., electrolyte temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 251 determines which tasks are performable on a substrate. Preferably, the program is software readable by the system controller 251 that includes code to perform tasks relating to monitoring and execution of the electrochemical process recipe tasks and various chamber process recipe steps.

In one embodiment of step 206, one or more direct current (DC) and/or pulse plating waveforms are delivered to the seed layer 321 during the electrochemical deposition process to form the metal layer 322 that has desirable electrical and mechanical properties. The applied bias may have a waveform that is DC and/or a series of pulses that may have a varying height, shape and duration to form the conductor 325. In one embodiment, a first waveform is applied to the seed layer 321 by use of a power supply 250 to cause some electrochemical activity at the surface of the seed layer. In this case, while the bias applied to the seed layer need not always be cathodic, the time average of the energy delivered by the application of the first waveform is cathodic and thus will deposit a metal on the surface of the seed layer 321. In another embodiment, it may be desirable to have a time average that is anodic (i.e., dissolution of material) to clean the surface of the seed layer prior to performing the subsequent filling process steps. The concentration gradients of metal ions, additives or suppressors in the electrolyte "A" (FIGS. 4A and 4D) in the proximity of the conductor 325 are affected by the polarity, sequencing, and durations of bias delivered to the surface of the substrate. For example, it is believed that the duration of a deposition pulse during a pulse plating type process controls the deposition on the sidewall of the feature, while the dissolution pulse creates additional metal ions and thus, a concentration gradient of these ions, around the feature. An example of a pulse plating process that may be used to form a metal feature on the substrate surface is further described in the co-pending U.S. patent application Ser. No. 11/552,497, filed Oct. 24, 2006 and entitled "Pulse Plating of a Low Stress Film on A Solar Cell Substrate", which is herein incorporated by reference in its entirety. However, it is desirable to reduce or eliminate the use of anodic pulses in an effort to increase the deposition rate and thus substrate throughput through the plating cell and CoO of the system.

Figure 6:
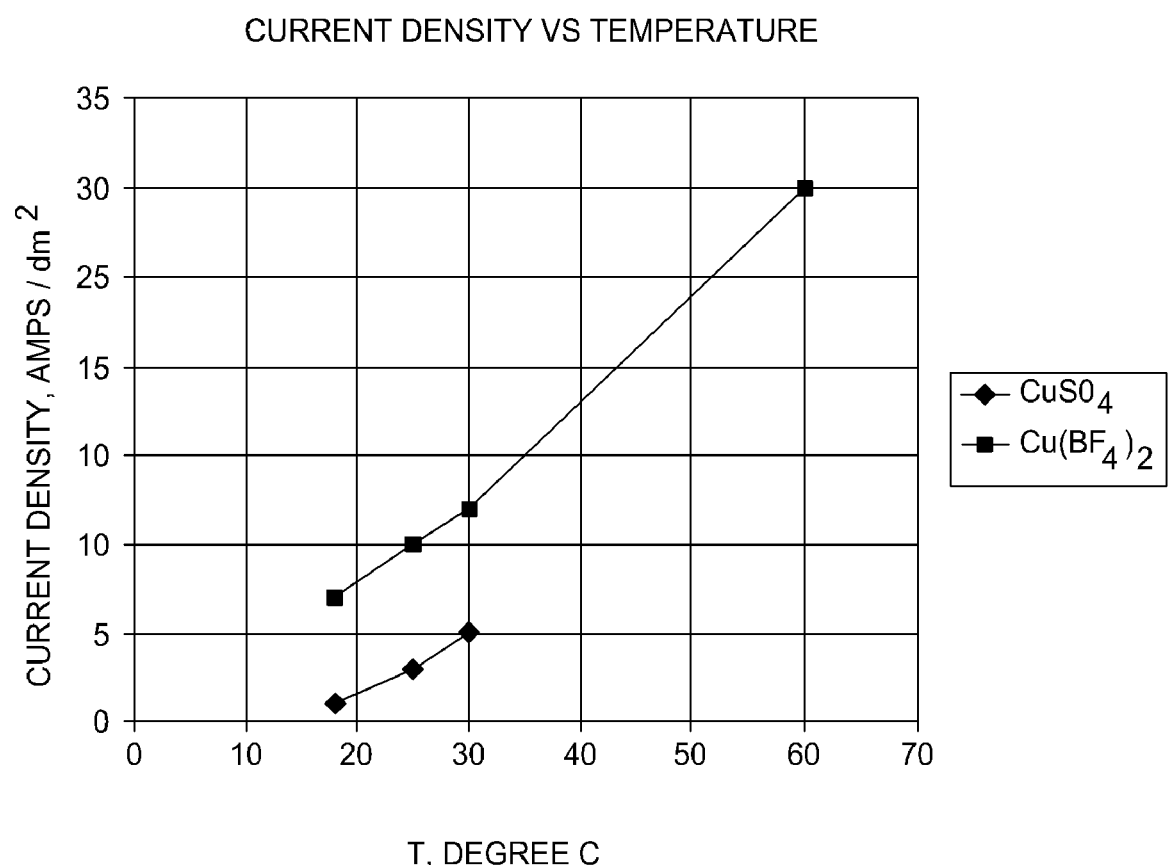
FIG. 6 illustrates a graph of the effect of temperature on deposition rate according to one embodiment described herein.

In an effort to improve metallized substrate throughput in the electrochemical plating cell 400 by increasing the deposition rate of one or more of the electrochemically deposited layers (e.g., metal layer 322, interfacial layer 323 (discussed below)) it is desirable to adjust and control the temperature of the electrolyte during the deposition process. In one embodiment, the temperature of the electrolyte is controlled within a range of about 18° C. and about 85° C., and preferably between about 30° C. and about 70° C. to maximize the plating rate. It should be noted that evaporation losses becomes an larger issue as the temperature of the electrolyte is increased, since if not monitored and controlled will cause precipitation of one or more components in the electrolyte bath, which can generate particles and affect the deposited film quality and composition. FIG. 6 illustrates a graph of the effect of temperature on maximum current density for two different electrolyte chemistries described in Example 1 and Example 2, shown below. In this example it is desirable to run the copper fluoroborate ($Cu(BF_4)_2$) bath a temperatures greater than about 30° C. to improve the deposition rate by about 3 to 7 times from a typical electrolyte bath that is run at a temperature around room temperature.

Electrolyte Solution

In general, it is desirable to form a conductor 325 that is defect free, has a low stress that can be rapidly deposited on the substrate surface. The electrochemical process performed in the electrochemical plating cell 400 utilizes an electrolyte solution containing a metal ion source and an acid solution. In some cases one or more additives, such as an accelerator, a suppressor, a leveler, a surfactant, a brightener, or combinations thereof may be added to the electrolyte solution to help control the stress, grain size and uniformity of the electrochemically deposited metal layer(s). However, additives generally make the control of the electrochemical process more complex and make the cost of the consumables generated during the electrochemical plating process to increase, since they are generally consumed or breakdown during the electrochemical process. In one embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.). In general it is desirable to increase the metal ion concentration in the electrolyte to improve the electrochemical characteristics of the plating bath, such as improving the diffusion boundary layer and limiting current characteristics of the cell when high plating rates are used to electrochemically deposited a metal layer.

In one example, the metal ion source within the electrolyte solution used in step 206 in FIGS. 2 is a copper ion source. In one embodiment, the concentration of copper ions in the electrolyte may range from about 0.1 M to about 1.1M, preferably from about 0.4 M to about 0.9 M. Useful copper sources include copper sulfate ($CuSO_4$), copper chloride ($CuCl_2$), copper acetate ($Cu(CO_2CH_3)_2$), copper pyrophosphate ($Cu_2P_2O_7$), copper fluoroborate ($Cu(BF_4)_2$), derivatives thereof, hydrates thereof or combinations thereof. The electrolyte composition can also be based on the alkaline copper plating baths (e.g., cyanide, glycerin, ammonia, etc) as well.

EXAMPLE 1

In one example, the electrolyte is an aqueous solution that contains between about 200 and 250 g/l of copper sulfate pentahydrate ($CuSO_4.5(H_2O)$), between about 40 and about 70 g/l of sulfuric acid ($H_2SO_4$), and about 0.04 g/l of hydrochloric acid (HCl). In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH. Could go to high copper concentration with organic complexing agent to solution, such as MSA. In one aspect, a low acid chemistry is used to complete the high speed deposition process. An example of some exemplary copper plating chemistries that may be used for high speed plating is further described in commonly assigned U.S. Pat. Nos. 6,113,771, 6,610,191, 6,350,366, 6,436,267, and 6,544,399, which are all incorporated by reference in their entirety.

EXAMPLE 2

In another example, the electrolyte is an aqueous solution that contains between about 220 and 250 g/l of copper fluoroborate ($Cu(BF_4)_2$), between about 2 and about 15 g/l of tetrafluoroboric acid ($HBF_4$), and about 15 and about 16 g/l of boric acid ($H_3BO_3$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

EXAMPLE 3

In yet another example, the electrolyte is an aqueous solution that contains between about 60 and about 90 g/l of copper sulfate pentahydrate ($CuSO_4.5(H_2O)$), between about 300 and about 330 g/l of potassium pyrophosphate ($K_4P_2O_7$), and about 10 to about 35 g/l of 5-sulfosalicylic acid dehydrate sodium salt ($C_7H_5O_6SNa.2H_2O$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

EXAMPLE 4

In yet another example, the electrolyte is an aqueous solution that contains between about 30 and about 50 g/l of copper sulfate pentahydrate ($CuSO_4.5(H_2O)$), and between about 120 and about 180 g/l of sodium pyrophosphate decahydrate ($Na_4P_2O_7.10(H_2O)$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In one embodiment, it may be desirable to add a second metal ion to the primary metal ion containing electrolyte bath (e.g., copper ion containing bath) that will plate out or be incorporated in the growing electrochemically deposited layer or on the grain boundaries of the electrochemically deposited layer. The formation of a metal layer that contains a percentage of a second element can be useful to reduce the intrinsic stress of the formed layer and/or improve its electrical and electromigration properties. In one example, it is desirable to add an amount of a silver (Ag), nickel (Ni), zinc (Zn), or tin (Sn) metal ion source to a copper plating bath to form a copper alloy that has between about 1% and about 4% of the second metal in the deposited layer.

In one example, the metal ion source within the electrolyte solution used in step 206 in FIG. 2 is a silver, tin, zinc or nickel ion source. In one embodiment, the concentration of silver, tin, zinc or nickel ions in the electrolyte may range from about 0.1 M to about 0.4 M. Useful nickel sources include nickel sulfate, nickel chloride, nickel acetate, nickel phosphate, derivatives thereof, hydrates thereof or combinations thereof.

Contact Interface Layer in a Single Substrate Electrochemical Plating Cell

Figure 3E:
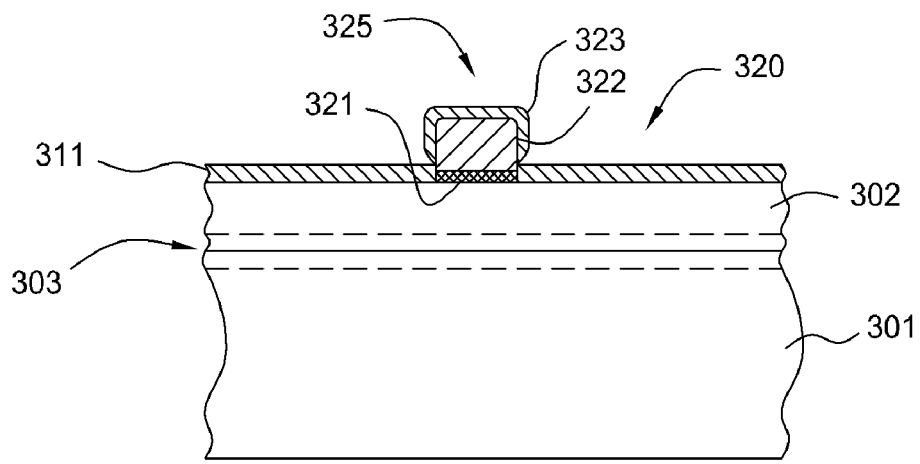

Referring to FIGS. 2 and 3E, in step 208 an optional contact interface layer 323 is deposited over the surface of the metal layer 322 formed during step 206. The contact interface layer 323 can be formed using an electrochemical deposition process, an electroless deposition process, a CVD deposition process, or other comparable deposition processes to form a good ohmic contact between the formed conductors 325 and an external interconnection bus (not shown) that is adapted to connect one or more solar cells together. In one embodiment, the contact interface layer 323 is formed from a metal that is different from the metal contained in the metal layer 322. In this configuration the contact interface layer 323 may be formed from a pure metal or metal alloy that contains metals, such as tin (Sn), silver (Ag), gold (Au), copper (Cu) or lead (Pb). In one embodiment, the thickness of the contact interface layer 323 may be between about 3 µm and about 7 µm. Forming a contact interface layer 323 having a thickness greater than 3 µm is generally hard to accomplish using conventional electroless, PVD and CVD techniques at an acceptable substrate throughput and/or desirable deposition thickness uniformity.

In one embodiment, the contact interface layer 323 is formed by use of an electrochemical process. In some cases it is desirable to perform step 208 in the same electrochemical plating cell as step 206 was performed. In this configuration, the seed layer 321 and metal layer 322 are cathodically biased relative to an electrode (e.g., electrode 420 in FIG. 4A) using a power supply that causes the ions in an contact interface layer electrolyte, which is brought into contact with the seed layer 321, metal layer 322 and the electrode, to plate the contact interface layer 323 on the surface of the seed layer 321 and/or metal layer 322. In the case where the contact interface layer 323 is formed in the same electrochemical plating cell 400 as the metal layer 322 and the contact interface layer 323 contains one or more different elements than the metal layer 322 the electrolyte used to form the metal layer will need to be discarded and replaced with the new contact interface layer electrolyte to form the contact interface layer 323.

Contact Interface Layer Electrolyte Solution

In one embodiment, the contact interface layer 323 contains tin (Sn) and is deposited by use of an electrochemical deposition process. The concentration of tin ions in the contact interface layer electrolyte may range from about 0.1 M to about 1.1 M. Useful tin sources include tin sulfate ($SnSO_4$), tin chloride ($SnCl_2$), and tin fluoroborate ($Sn(BF_4)_2$), derivatives thereof, hydrates thereof or combinations thereof. In another embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.). The electrolyte composition can also be based on the alkaline tin plating baths (e.g., glycerin, ammonia, etc) as well. The electrolyte may also contain methane-sulfonic acid (MSA).

In one example, the electrolyte is an aqueous solution that contains between about 200 and 250 g/l of tin sulfate pentahydrate ($SnSO_4.5(H_2O)$), between about 40 and 70 g/l of sulfuric acid ($H_2SO_4$), and about 0.04 g/l of hydrochloric acid (HCl). In some cases it is desirable to add one or more organic additives (e.g., levelers, accelerators, suppressors) to promote uniform growth of the deposited layer. In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

Multiple Metallization Steps

The embodiments discussed above in conjunction with FIGS. 2-5 can be used to form one or more of the conductors 325 on a surface of the substrate. While it is generally desirable to form all of the various contact structures used to form a solar cell device at one time, this is sometimes not possible due to various processing constraints. In some cases two metallization processes are required, for example, to form a front side contact, as shown in FIGS. 3A-3E, and a second metallization process to form a second contact on a different region of the metallized substrate 320, such as a backside contact 330 shown in FIG. 3E.

Figure 3F:
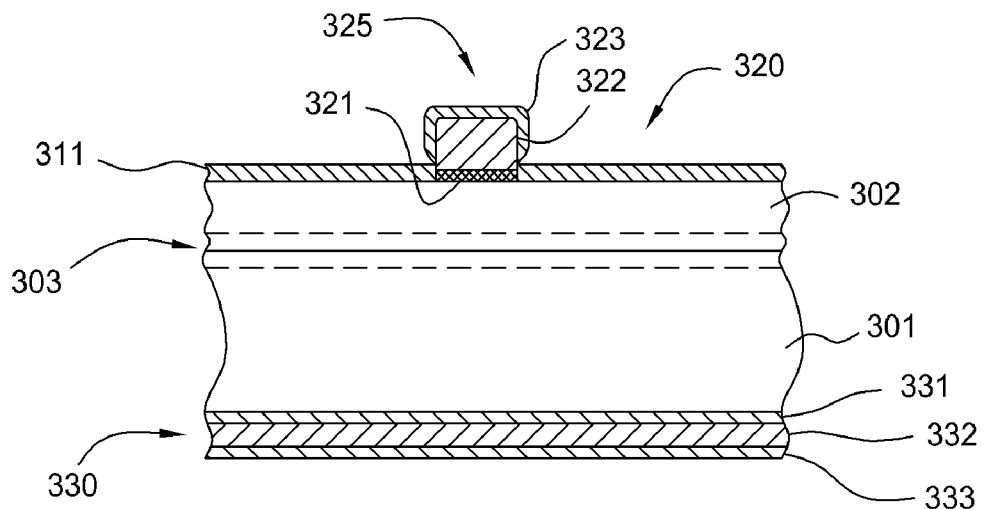

As shown in FIG. 3F, the second metallization step can be used to form the backside contact 330 that is adapted to connect to an active region (e.g., p-type region in FIG. 3A) of the solar cell device. In this example, seed layer 331 can be formed using the process steps described above in conjunction with step 204 or other similar techniques. Next, a metal layer 332 and an interconnect layer 333 may be formed using the process steps described above in conjunction with steps 206-208 and FIGS. 2, 3D-3E and 4. Preferably, the total exposed area of the apertures 413 in the masking plate 410 (FIGS. 4A-4D) used to form the backside contact on the substrate surface is between about 70% and about 99% of the surface area of the backside surface of the substrate.

Batch Processing Apparatus

In an effort to further increase the substrate throughput through the solar cell plating apparatus, groups of the metallized substrates 320 may be plated at once in a batch type plating operation. FIG. 7A illustrates is a side cross-sectional view of a batch plating apparatus 701 that contains three plating cells 710 that are each adapted to plate one or more metal layers on a metallized substrate surface using the process steps described above (e.g., steps 206-208). While FIG. 7A illustrates a batch plating apparatus 701 that contains three horizontally oriented plating cells 710, this configuration is not intended to be limiting as to the number plating cells that may be used to perform a batch type plating process or the angular orientation of the plating cells relative to each other or to the horizontal. In one aspect, two or more plating cells may be used to perform a batch plating process where two or more substrates are plated at once. In another aspect, the substrates are oriented vertically in the batch plating apparatus during the plating process.

Referring to FIG. 7A, in one embodiment, the batch plating process is performed by immersing two or more plating cells 710 in a plating tank 751 and then biasing each of the metallized substrates relative to one or more electrodes. As shown in FIG. 7A, each of the plating cells 710 may contain an electrode 420, power supply (e.g., item #s 450A-450C) and a head assembly 405 that is adapted to hold and retain the metallized substrate 320 during the plating process. However, in one embodiment, the plating cells 710 may each contain any of the components described above in conjunction with FIGS. 4A-4D. In each plating cell 710 the head assembly 405 may contain a thrust plate 414 that is used to urge the metallized substrate 320 against the electrical contacts 412 and masking plate 410 by use of an actuator (see FIG. 4B). During operation the metallized substrates 320 are loaded into the head assemblies 405 of the respective plating cells 710 and then the plating cells 710 are immersed in the electrolyte "A" contained in the plating tank 751 so that a plating process can be performed. In one embodiment, during a batch plating process the seed layer 321 on the surface of each of the metallized substrates 320 in each of the plating cells 710 are biased relative to the electrode 420 contained in the respective plating cell 710 using a power supply. In one aspect, as shown in FIG. 7A, each electrode 420 in each plating cell 710 is biased independently from each other using a power supply, such as power supply 250A in the top most plating cell, power supply 250B in the middle plating cell 710 and power supply 250C in the lower plating cell 710. To improve the hydrodynamic and diffusion boundary layers the electrolyte may be delivered to the region between the electrode 420 and the metallized substrate 320 using a fluid delivery system 441 that contains a pump 440. In one aspect, it may be desirable to rotate the metallized substrates and/or electrodes 420 during the batch plating process using conventional techniques. While FIG. 7A illustrates the plating cells 710 in a horizontal orientation this configuration is not intended to be limiting, since the plating cells 710 could oriented vertically or at any angle relative to the horizontal without varying from the scope of the invention.

Figure 7B:
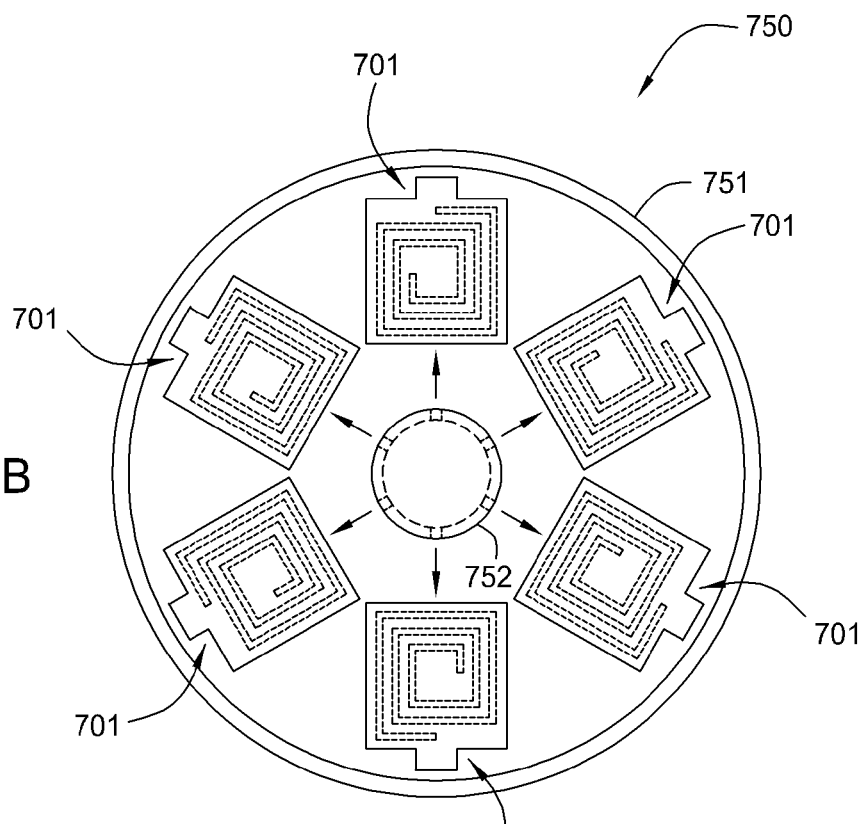
FIG. 7B illustrates a plan view of a batch electrochemical deposition system according to one embodiment described herein.
Figure 7I:
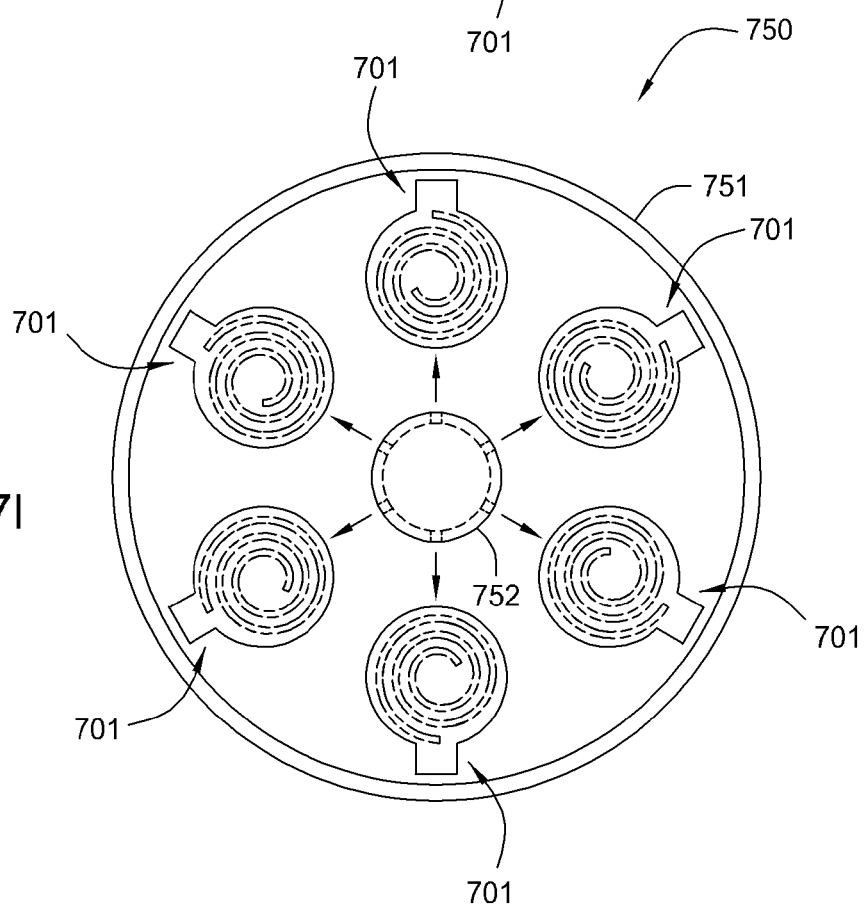
FIG. 7I illustrates a plan view of a batch electrochemical deposition system according to one embodiment described herein.

FIG. 7B illustrates a plan view of a batch plating system 750 that contains an array of the batch plating apparatuses 701 illustrated in FIG. 7A. In this configuration, an array of plating cells 710 in each of the batch plating apparatuses 701 are immersed with an electrolyte retained in the plating tank 751 so that steps 206 or 208 can be performed. In one embodiment, an array of plating cells 710 in each of the batch plating apparatuses 701 are distributed around a spraying device 752 that is adapted to deliver a flow of electrolyte to a region between the electrode 420 and substrate 320 contained within each of the plating cells 710. The spraying device 752 may connected to a pump (not shown) that is adapted to recirculate the electrolyte through the plating cells 710. FIG. 7I illustrates a plan view of a batch plating system 750 that contains an array of the batch plating apparatuses 701 illustrated in FIG. 7A that are adapted to process circular type substrates.

Figure 7C:
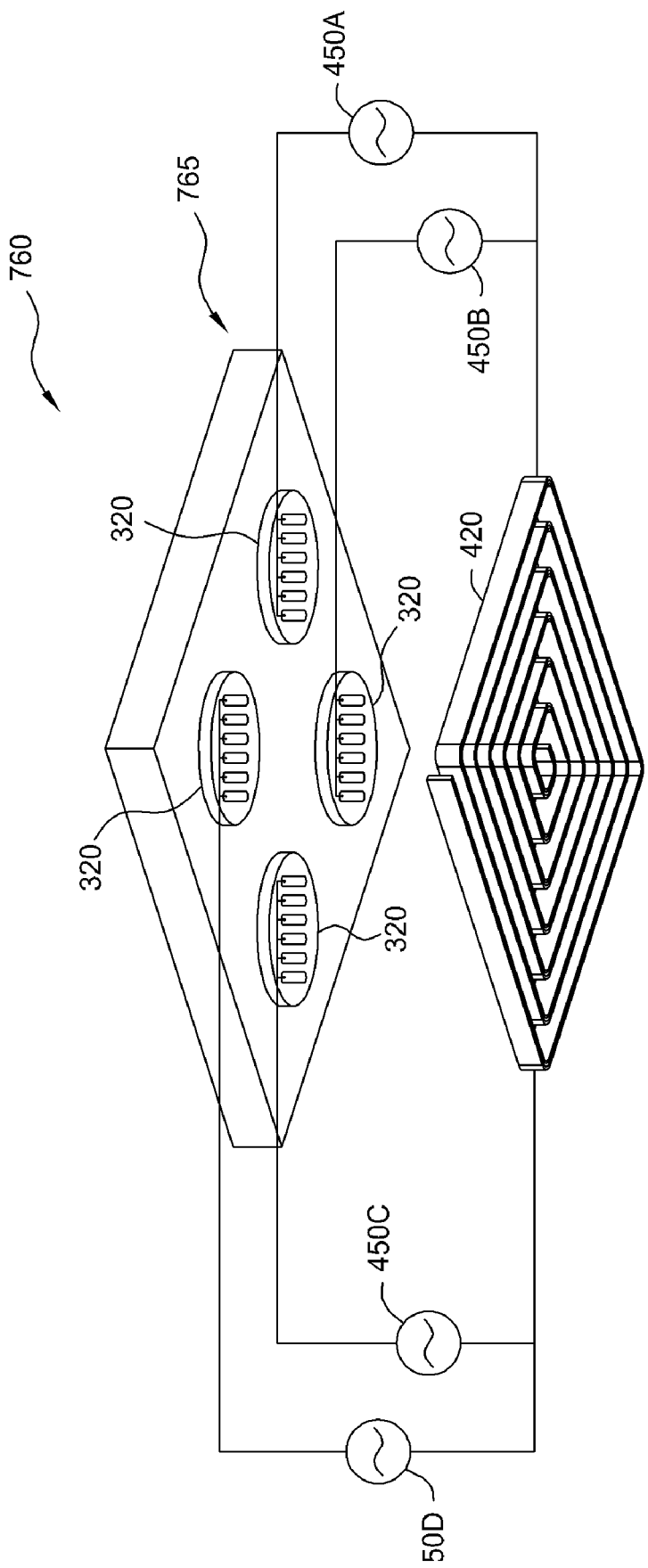
FIG. 7C illustrates an isometric view of a batch electrochemical deposition chamber according to one embodiment described herein.

FIG. 7C illustrates an isometric view of another embodiment of a batch plating system, hereafter batch plating system 760, which is adapted to plate multiple metallized substrates that are arrayed in horizontal orientation and immersed within an tank containing an electrolyte solution. In one embodiment, the head assembly 765 is adapted to retain a plurality of substrates in a desirable position relative to an electrode 420. In this configuration each of the metallized substrates 320 may be separately biased relative to the electrode 420 using one of the dedicated power supplies 450A-450C. In one embodiment, one or more masking plates (not shown) may be positioned against the surface of the substrates retained in the head assembly 765 to allow for a preferential deposition of desired regions on each of the substrates. In one aspect, the electrode 420 may be formed from a plurality of electrodes that can be separately biased relative to a metallized substrate 320. While the metallized substrates in FIG. 7C, are circular in shape this configuration is not intended to limiting as to the scope of invention described herein.

In another embodiment, the plating apparatus, chamber and plating cell may also utilize a conveyor type design that continuously plate a number of substrates at one time, for example, between 25 and 1000 substrates. The substrates in any of the processes described herein may be oriented in a horizontal, vertical or angled orientation relative to the horizontal during step 206.

Figure 7D:
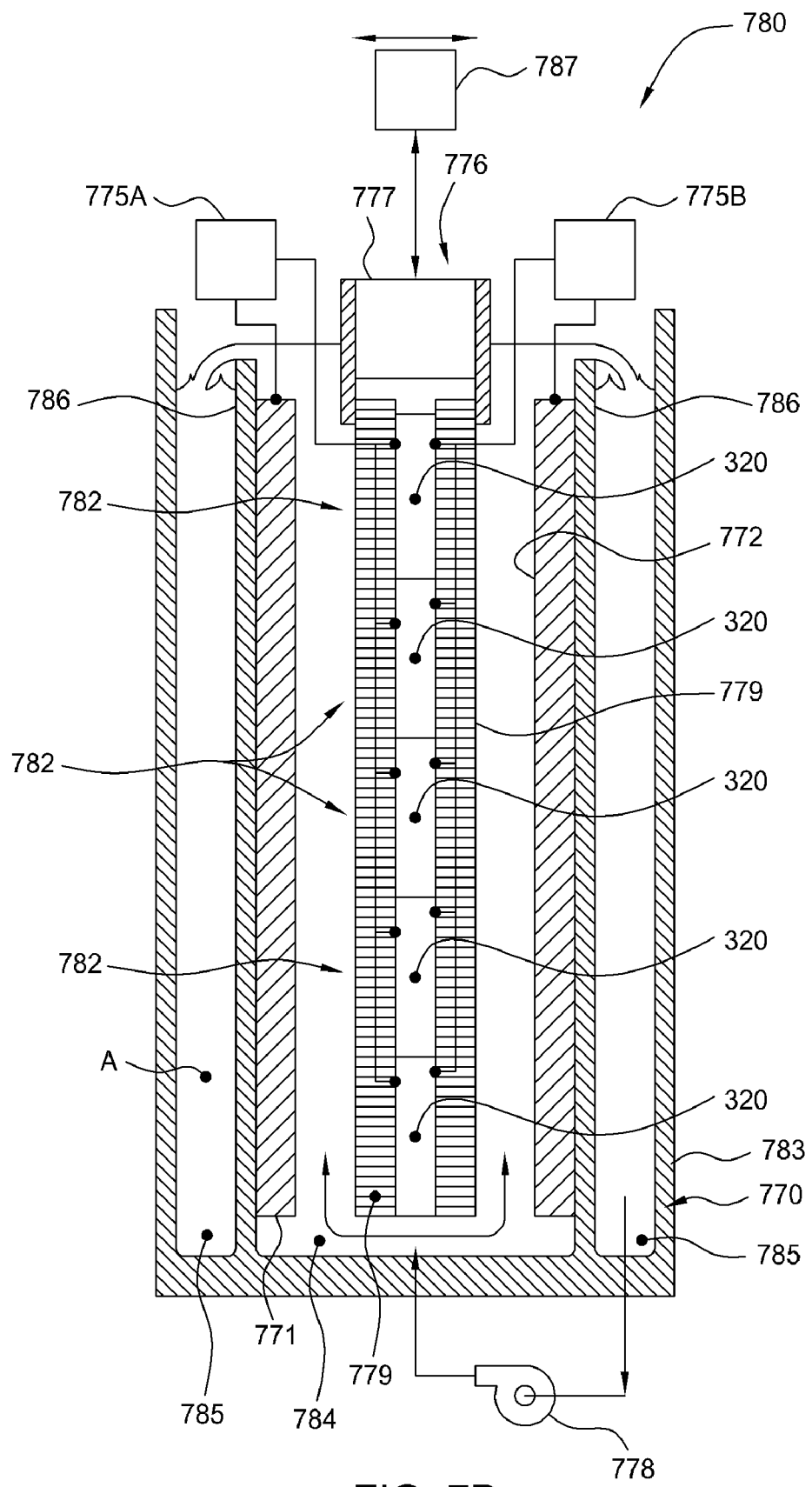
FIG. 7D illustrates a side cross-sectional view of a batch electrochemical deposition chamber according to one embodiment described herein.

FIGS. 7D-7F illustrate one embodiment of a batch plating chamber 780 that is adapted to plate both sides of multiple metallized substrates 320 that are immersed within an electrolyte tank 770. The batch plating chamber 780 may be adapted to sequentially plate each side of multiple metallized substrates 320, or plate both sides of multiple metallized substrates 320 at the same time. FIG. 7D illustrates a side cross-sectional view of a batch plating chamber 780 that is adapted to deposit a metal layer on the surface of the metallized substrates 320 using steps 206 and/or 208, discussed above. The batch plating chamber 780 generally contains a head assembly 776, one or more electrodes (e.g., reference numerals 771, 772), an electrolyte tank 770, and one or more power supplies (e.g., reference numerals 775A, 775B) that are adapted to form one or more conductors 325 on a surface of the metallized substrate 320. While FIG. 7D illustrates a batch plating chamber 780 that contains a plurality of vertically oriented metallized substrates, this configuration is not intended to be limiting as to the scope of the invention. In another aspect, the substrates are oriented horizontally in the batch plating apparatus during the plating process.

FIG. 7D illustrates an isometric view of the head assembly 776 that contains a plurality of cell assemblies 782 that are adapted to retain and preferentially form the conductors 325 on one or more surfaces of the plurality of metallized substrates 320 using an electrochemical plating process. In one embodiment, the cell assemblies 782 contain at least one masking plate assembly 779, an actuator 777, and a support frame 781 that are adapted to hold and make electrical contact to a conductive layer (e.g., seed layer 321) formed on one or more sides of the metallized substrates 320. While the head assembly 776, illustrated in FIG. 7E, contains 20 cell assemblies 782 this configuration is not intended to be limiting to the scope of the invention, since the head assembly 766 could contain two or more cell assemblies 782 without varying from the scope of the invention described herein. In one example, the cell assembly 782 contains between about 2 and about 1000 metallized substrates at one time.

In one embodiment, the masking plate assemblies 779 may contain a plurality of masking plates 410 (FIG. 4A) that are held together by a supporting structure (not shown) that allows each of the masking plates 410 to contact a surface of a metallized substrate so that apertures 413 and contacts 412 (FIG. 4A) contained therein can be used to preferentially form the conductors 325 on a surface of each of the metallized substrates 320. In another embodiment, the masking plate assemblies 779 is a plate, or multiple plates, that are adapted to contact multiple metallized substrates 320 at one time so that apertures 413 formed therein can be used to preferentially form the conductors 325 on the surface of each of the metallized substrates 320.

FIG. 7F illustrates a close-up partial section view of one cell assembly 782 that can be used to form a metal layer on the feature 425 through an aperture 413 formed in the masking plate assembly 779. In one embodiment, the contacts 412 (FIG. 4A) are electrically connected to portions of the support frame 781 so that a bias can be applied to each of the contacts in each of the cell assemblies 782 relative to one of the one or more electrodes 771, 772 by use of a single electrical connection to a single power supply. In another embodiment, discrete electrical connections (not shown for clarity) provided through the masking plate assembly 779 or support frame 781 to each of one or more of the contacts 412 in each of the cell assemblies 782 so that each of the one or more of the contacts 412 can be separately biased relative to one of the one or more electrodes 771, 772 by use of different power supplies.

Referring to FIG. 7D, the electrolyte tank 770 generally contains a cell body 783 and one or more electrodes 771, 772. The cell body 783 comprises a plating region 784 and an electrolyte collection region 785 that contains an electrolyte (e.g., item "A") that is used to electrochemically deposit the metal layer on a conductive region formed on the substrate surface. In one aspect, the electrode 771, 772 are positioned vertically in the plating region 784 and are supported by one ore more of the walls of the cell body 783. In general, it is desirable to increase the surface area of the anode so that high current densities can applied to the electrodes 771, 772 relative to the conductive regions (e.g., seed layer 321 in FIG. 4A) to increase the plating rate. An example of a high surface area electrode that may be used here is discussed above in conjunction with the electrode 420. The electrodes 771, 772 can be formed so that they have a desired shape, such as square, rectangular, circular or oval. The electrodes 771, 772 may be formed from material that is consumable (e.g., copper) during the electroplating reaction, but is more preferably formed from a non-consumable material.

In operation, a metallized substrate 320 is positioned in each of the cell assemblies 782 within the head assembly 776 so that electrical contacts (e.g., reference numerals 412 in FIGS. 4A-4D), found in each cell assembly 782, can be placed in contact with one or more conductive regions on the metallized substrate surface. In one embodiment, the metallized substrates 320 are positioned on the support frame 781 within each cell assembly 782 and then are clamped to the support frame 781 by use of the actuator 777 (e.g., air cylinder) contained in the head assembly 776 so that the masking plate assembly 779 and contacts 412 can contact the substrate surface. In another embodiment, the metallized substrates are placed between opposing masking plate assemblies 779 and then clamped together by use of the actuator 777. After the electrical connection between the contacts and the conductive regions has been made the head assembly 776 is immersed into the electrolyte contained in the electrolyte tank 770 so that a metal layer (e.g., reference numeral 322) can be formed on the conductive regions by biasing them relative to the one or more electrodes 771, 772 using one or more of the power supplies 755A, 775B.

Referring to FIG. 7D, the electrolyte tank 770 may also contain a pump 778 may be adapted to deliver the electrolyte from the electrolyte collection region 785 to the surface of the metallized substrates contained in the head assembly 776. In one embodiment, the pump 778 is adapted to deliver electrolyte to a gap formed between the head assembly 776 and the electrodes 771, 772 and then over a weir 786 and into the electrolyte collection region 785. The fluid motion created by the pump 778 allows the replenishment of the electrolyte components at the exposed regions of the substrates positioned in the head assembly 776. In one embodiment, to reduce the diffusion boundary layer it is desirable to move the head assembly relative to the electrodes 771, 772 during the step 206 by use of an actuator 787. In one embodiment, the actuator 787 comprises an AC motor, piezoelectric device or other similar mechanical component that can impart motion to the head assembly 776.

Figure 7G:
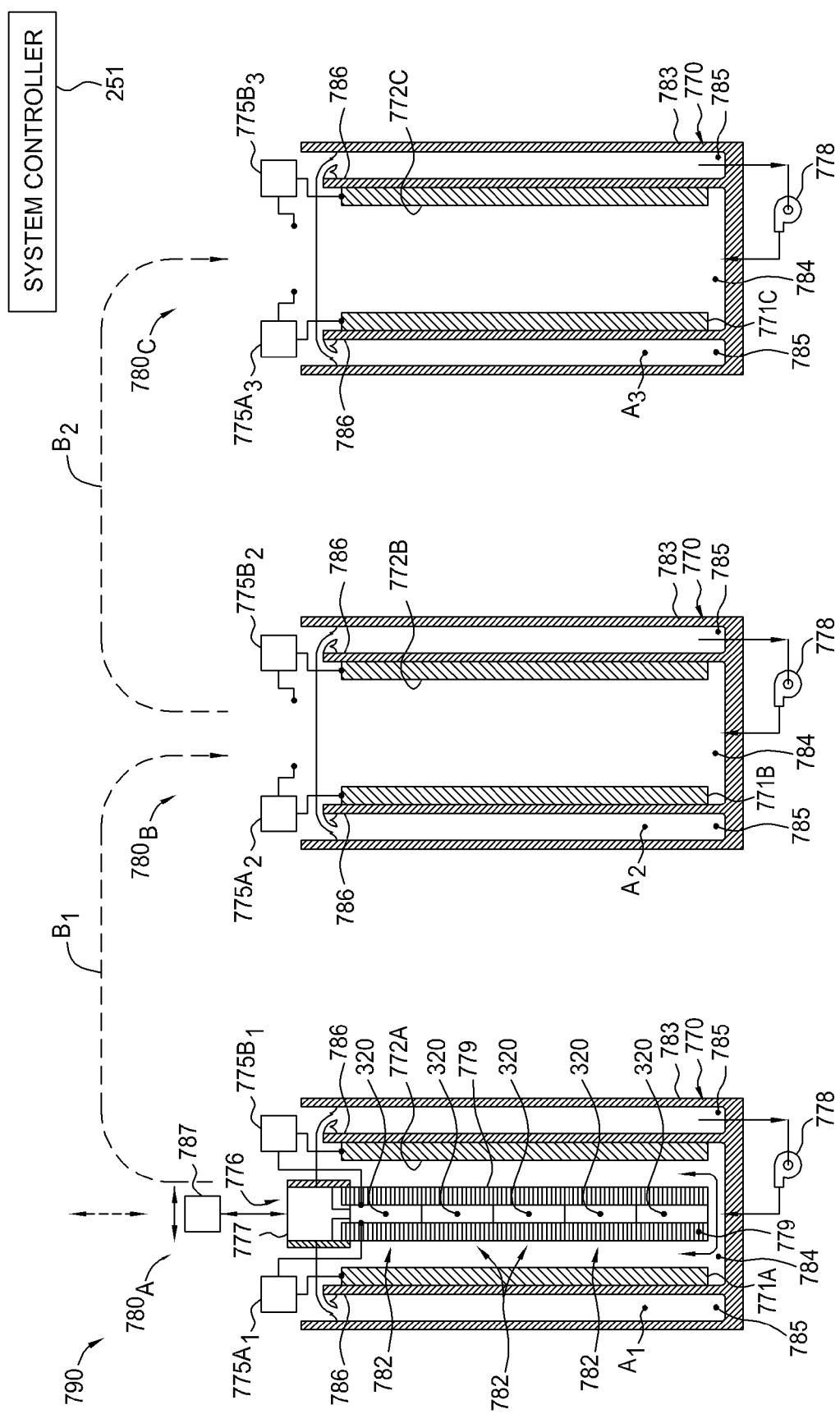
FIG. 7G illustrates a cross-sectional view of a batch electrochemical deposition system according to one embodiment described herein.

FIG. 7G illustrates a side cross-sectional view of a plating system 790 that contains two or more batch plating cells 780 that are positioned near each other so that the substrates positioned in the moveable head assembly 776 can be sequentially plated using different electrolytes or different plating parameters. In operation the head assembly 776 can be sequentially positioned in each of the batch plating cells 780 so that metal layers can be electrochemically deposited on the substrate surface by applying a bias to the individual substrates retained in the head assembly 776 relative to the electrodes 771, 772 contained in the batch plating cells 780. FIG. 7G illustrates, one embodiment that contains three batch plating cells 780A-780C that each contain different electrolytes, such as $A_1$, $A_2$, and $A_3$, respectively. The actuator 787 is a device, such as a conventional robot, gantry crane or similar devices, which can be used to lift and transfer the head assembly 776 between the various batch plating cells 780.

In one embodiment, during operation of the plating system 790 a head assembly 776 that contains one or more metallized substrates 320 is immersed in the first batch plating cell 780A that contains a first electrolyte $A_1$ so that a first metal layer can be formed on the surface of the metallized substrates 320. The one or more metallized substrates 320 contained in the head assembly 776 may be plated by biasing conductive features on the substrate surfaces relative to one or more of the electrodes 771A, 772A positioned in the electrolyte $A_1$ using one or more of the power supplies $775A_1$, $775B_1$. After depositing a desired amount of material on the surface of the substrates the head assembly 776 is transferred following path $B_1$ to an adjacent second batch plating cell 780B so that a second metal layer can be deposited on the surface of the metallized substrates. The metallized substrates 320 contained in the head assembly 776 may be plated by biasing conductive features on the substrate surfaces relative to one or more of the electrodes 771 B, 772B positioned in the electrolyte $A_2$ using one or more of the power supplies $775A_2$, $775B_2$. After depositing a second desired amount of material on the surface of the substrates the head assembly 776 is transferred following path $B_2$ to an adjacent third batch plating cell 780C so that a third metal layer can be deposited on the metallized substrate surface. The metallized substrates 320 contained in the head assembly 776 may be plated by biasing conductive features on the substrate surfaces relative to one or more of the electrodes 771C, 772C positioned in the electrolyte $A_3$ using one or more of the power supplies $775A_3$, $775B_3$. In one embodiment, it may be desirable to rinse the components contained within head assembly 776, including the metallized substrates, with DI water between plating steps to reduce the "drag-out" contamination of the subsequent electrolytes with electrolytes used in prior processes.

Figure 7H:
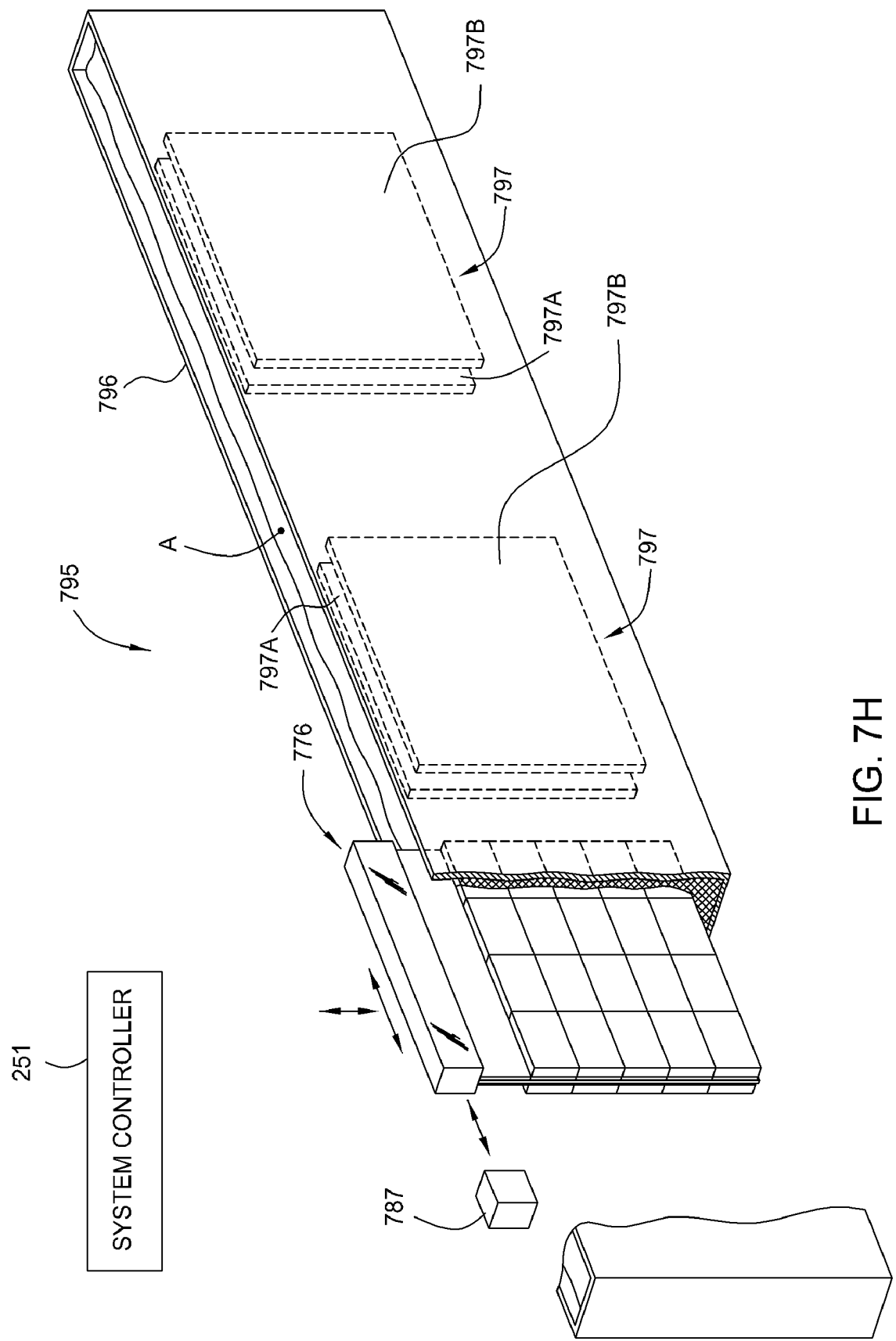
FIG. 7H illustrates an isometric view of a batch electrochemical deposition system according to one embodiment described herein.

FIG. 7H illustrates a side partial-sectional view of a plating system 795 that contains an electrolyte tank 796 that allows the substrates positioned in a head assembly 776 to be sequentially plated by positioning the head assembly 776 near two or more electrode assemblies 797 positioned in the electrolyte tank 796. In this configuration the substrates contained in the head assembly 776 are positioned within a single electrolyte "A" that is used in conjunction with a two or more electrode assemblies 797 to sequentially plate the substrates using different plating parameters (e.g., local electrolyte flow rate, current density). In operation, the metallized substrates 320 positioned in the head assembly 776 can be plated by positioning them near or slowly transferring them past each of the electrode assemblies 797 that are biased relative to the conductive features on the substrate surface. In one aspect, one or more of the plating parameters are varied as the head assembly 776 are positioned near different electrode assemblies 797. In one embodiment, both sides of a substrate are plated by electrically biasing a first electrode 797A positioned on one side of the head assembly 767 and by electrically biasing a second electrode 797B positioned on the other side of the head assembly 767 relative to the conductive features formed on the substrate surface using one or more power supplies (not shown) and the system controller 251. The actuator 787 is a device, such as a conventional robot, gantry crane or similar devices, that can be used to transfer the head assembly 776 "in" and "out" of the electrolyte tank 796 and near the various electrode assemblies 797. In this configuration multiple head assemblies 776 can be inserted into the electrolyte tank 796 at one time to allow for a more seemless "assembly line" type process flow through the various different process steps that may be used to form the conductors 325 on the surface of the substrates contained in each of the head assembly 776.

Referring to FIGS. 2, in one embodiment, an optional seed layer removal step, or step 209, is performed after completing step 208. The seed layer removal step generally entails performing a conventional wet or dry etching step to remove any unwanted and/or excess metal found on the surface of the substrate, such as unused or un-necessary portions of the seed layer 321. Conventional wet etching steps may involve immersing the substrate in an acidic or basic solution that is adapted to remove the unwanted and/or excess metal on the surface of the substrate. In one embodiment, a wet etch chemistry that preferentially etches the seed layer 321 versus the material in the interface layer 323.

Post Processing Steps

Referring to FIGS. 2, in step 210 one or more post processing steps are performed to reduce the stress or improve the properties of the deposited metal layers (e.g., metal layers 321, 322, 323, 331, 332, 333). The post processing steps that may be performed during step 210 may be include an anneal step, a clean step, a metrology step or other similar types of processing steps that are commonly performed on after metallizing a surface of the substrate. In one embodiment, an annealing step is performed on the solar cell substrate to reduce or even out the intrinsic stress contained in the formed metal layers. In one aspect, the annealing process is performed at a temperature between about 200 and 450° C. in a low partial pressure of nitrogen environment. In one aspect, an anneal process is used to enhance the electrical contact between the formed metal layers and/or the adhesion of the metal layers to the substrate surface, and silicide formation.

In one embodiment of the batch plating apparatuses, described above in relation to FIGS. 7A-7C, the electrolyte solution is removed from the plating tank 751 (FIGS. 7A and 7B) after processing and then a rinsing process is performed on the metallized substrates contained in each of the batch plating apparatuses 701. The rinsing process may include a DI water rinse and a spin dry step (e.g., rotating the head assembly 405) to remove the electrolyte from the surface of the substrate and dry the substrates.

Alternate Deposition Techniques Using a Masking Plate

Figure 8:
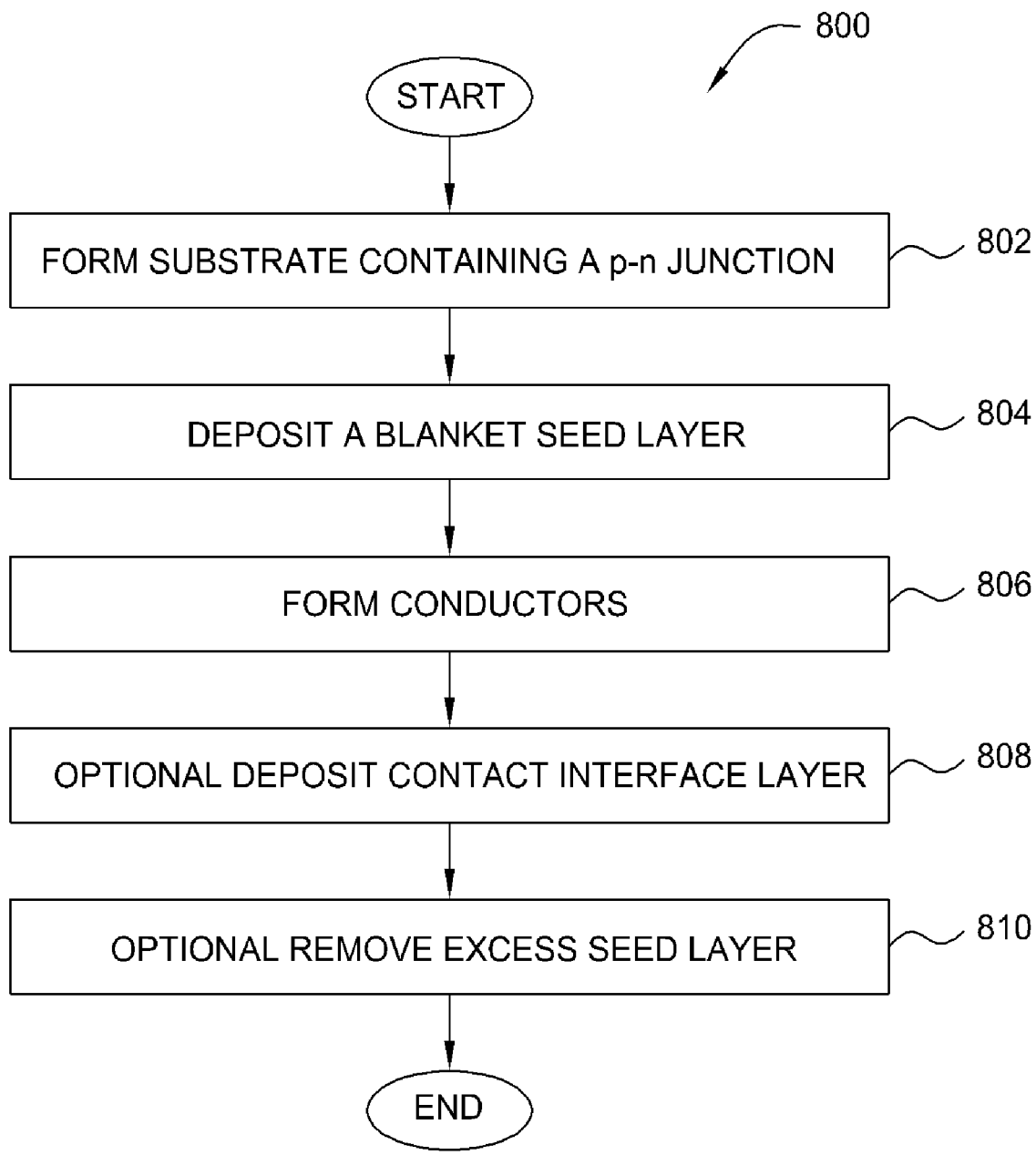
FIG. 8 illustrates a solar cell process sequence according to one embodiment described herein.

FIG. 8 illustrates a series of method steps 800 that are used to form metal contact structures on a solar cell device using the apparatus described herein. The processes described below may be used to form a solar cell having interconnects formed using any conventional device interconnection technique. Thus while the embodiments described herein are discussed in conjunction with the formation of a device that has the electrical contacts to the n-type and p-type junctions on opposing sides of the substrate this interconnect configuration is not intended to be limiting as to the scope of the invention, since other device configurations, such as PUM or multilayer buried contact structures (both contacts on one side), may be formed using the apparatus and methods described herein without varying from the basic scope of the invention.

Figure 9A:
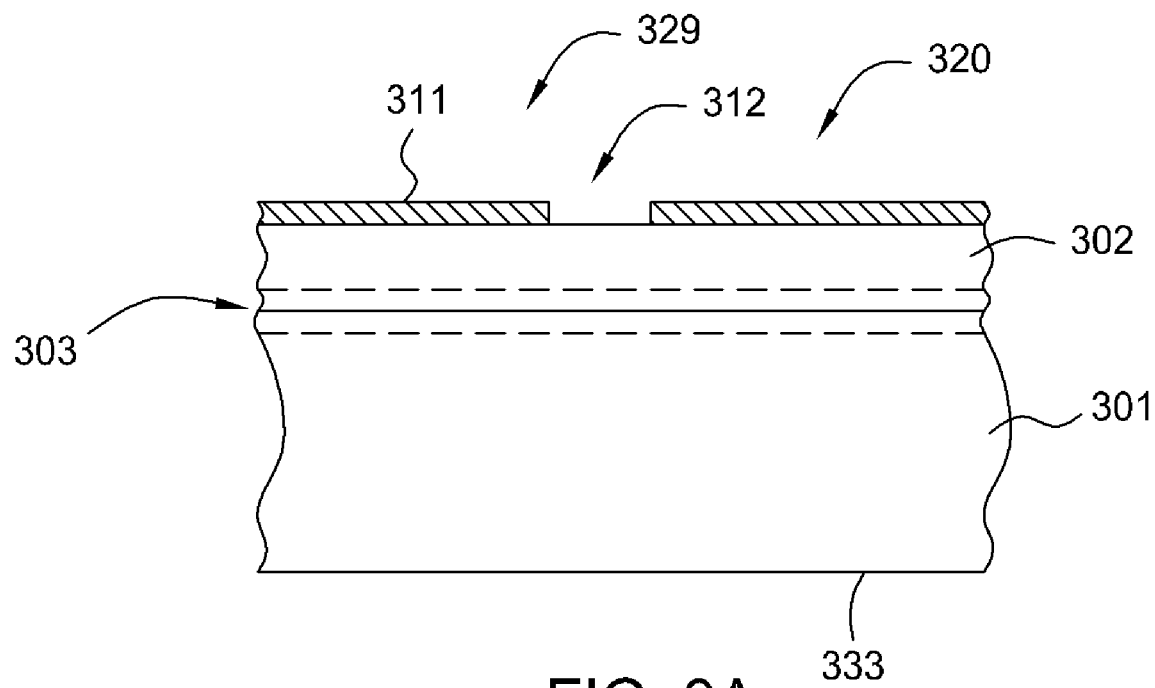
FIGS. 9A-9E illustrate schematic cross-sectional views of a solar cell during different stages of the process sequence described in FIG. 8.
Figure 9B:
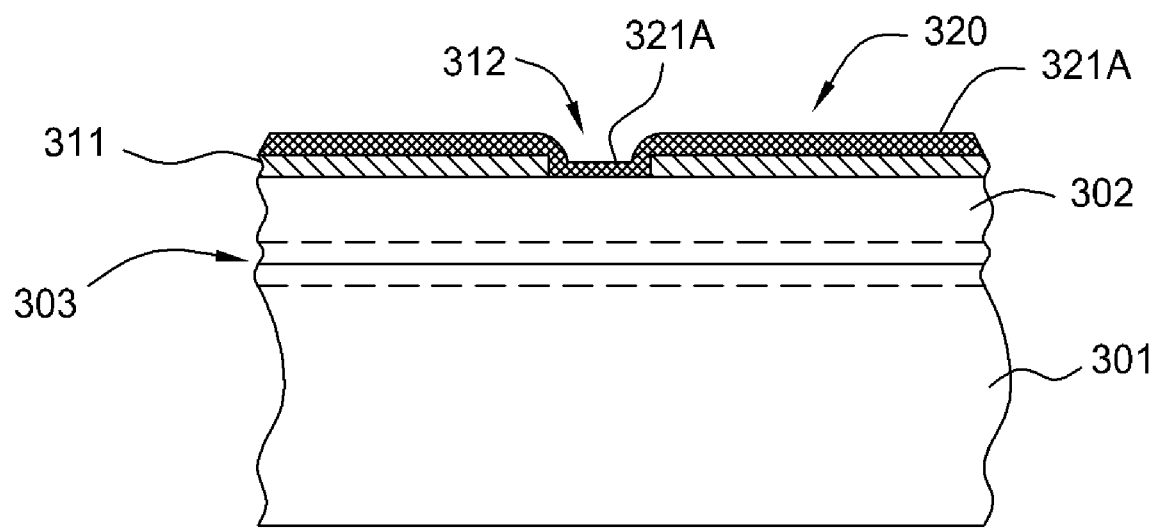

FIGS. 9A-9E illustrate the various states of a metallized substrate 320 after each step of method steps 800 has been performed. The method steps 800 start with step 802 in which a substrate 301 (FIG. 9A) is formed using conventional solar cell and/or semiconductor fabrication techniques. The substrate 301 may be formed using the steps described in step 202, discussed above. Referring to FIGS. 8 and 9B, in the next step, step 804, a blanket seed layer 321A is deposited over the surface of the substrate 301. In general, a blanket seed layer 321A may be deposited using a physical vapor deposition (PVD), chemical vapor deposition (CVD), molecular beam epitaxy (MBE), or atomic layer deposition (ALD) process.

Figure 9C:
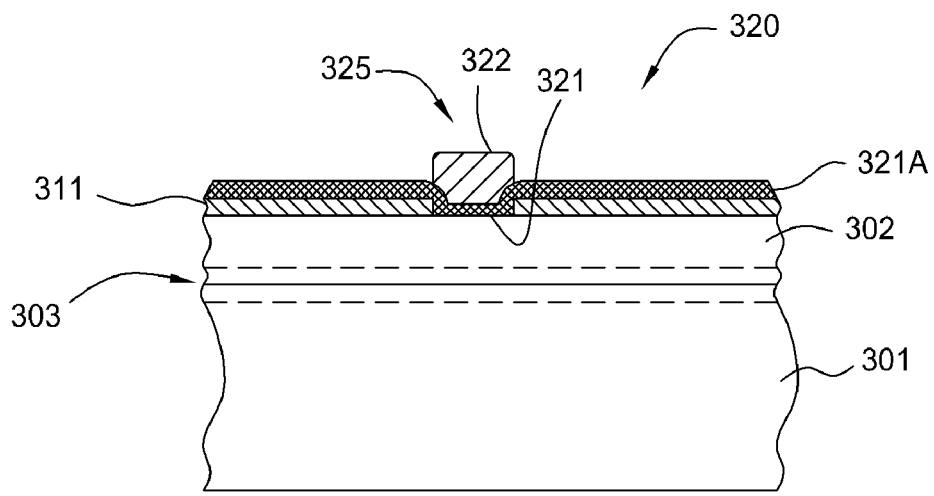

In the next step, step 806, the masking plate 410 (FIGS. 4A-4D) is used to mask regions of the blanket seed layer 321A and preferentially expose regions of the blanket seed layer 321A where the metal layer 322 of the conductors 325 are to be formed. Referring to FIG. 9C, during the step 806 an aperture (i.e., aperture 413 in FIG. 4A-4D) in the masking plate (reference numeral 410 in FIGS. 4A-4D) is positioned over a portion of the blanket seed layer 321A so that a conductor 325 can be formed thereon using of the apparatuses, chemicals and methods discussed in conjunction with step 206 above. In this process step, the blanket seed layer 321A is cathodically biased relative to an electrode (reference numeral 420 in FIGS. 4A-4D) using a power supply that causes the ions in an electrolyte to form a metal layer 322 on the exposed areas of the blanket seed layer 321A created within the apertures in the masking plate.

Figure 9D:
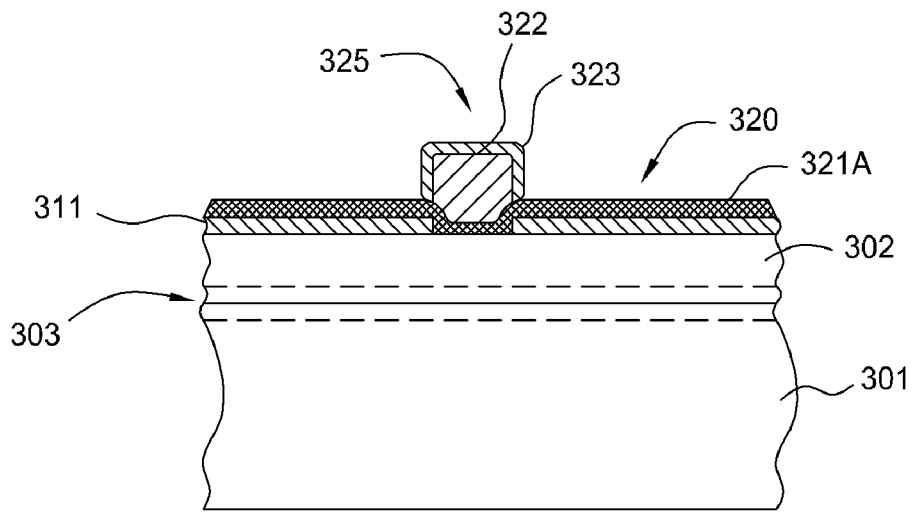

Referring to FIGS. 8 and 9D, in step 808, an optional contact interface layer 323 is deposited over the surface of the metal layer 322 formed during step 806. The contact interface layer 323 can be formed using an electrochemical deposition process that utilizes a masking plate (reference numeral 410 in FIGS. 4A-4D) to preferentially form an interface layer 323 over the metal layer 322 formed in step 806. The interface layer 323 formed in step 808 may be formed using the apparatus, chemicals and methods described above in conjunction with step 208.

Figure 9E:
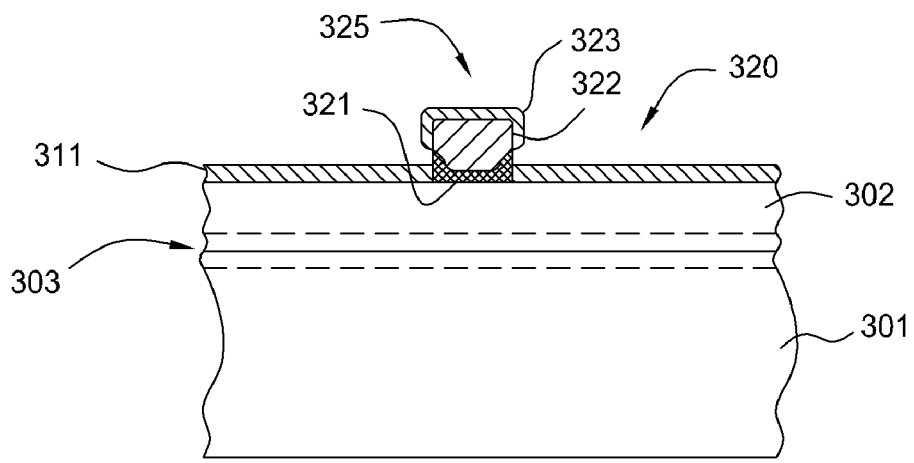

Finally, in step 810, as shown in FIG. 9E, the blanket seed layer 321A is removed from surface of the substrate. The blanket seed layer removal step generally entails performing a conventional wet or dry etching step to remove any unwanted and/or excess metal found on the surface of the substrate, such as unused portions of the blanket seed layer 321A. Conventional wet etching steps may involve immersing the substrate in an acidic or basic solution that is adapted to remove the unwanted and/or excess metal on the surface of the substrate. In one embodiment, a wet etch chemistry that preferentially etches the seed layer 321A versus the material in the interface layer 323 is used. In one embodiment, a backside metallization process is performed on the metallized substrate 320 after step 810 by use of a process similar to the one discussed above in conjunction the FIG. 3F, described above.

In an alternate embodiment, step 810 is performed prior to performing step 808. In this configuration, after the excess blanket seed layer 321A is removed from the surface of the metallized substrate 321A, thus leaving the metal layer 322 or a good portion thereof, so that the interface layer 323 can be preferentially formed on the metal layer 322 using an electroless deposition process, a conventional selective CVD deposition process, electrochemical deposition process, or other comparable deposition processes.

Alternate Deposition Processes

Figure 10:
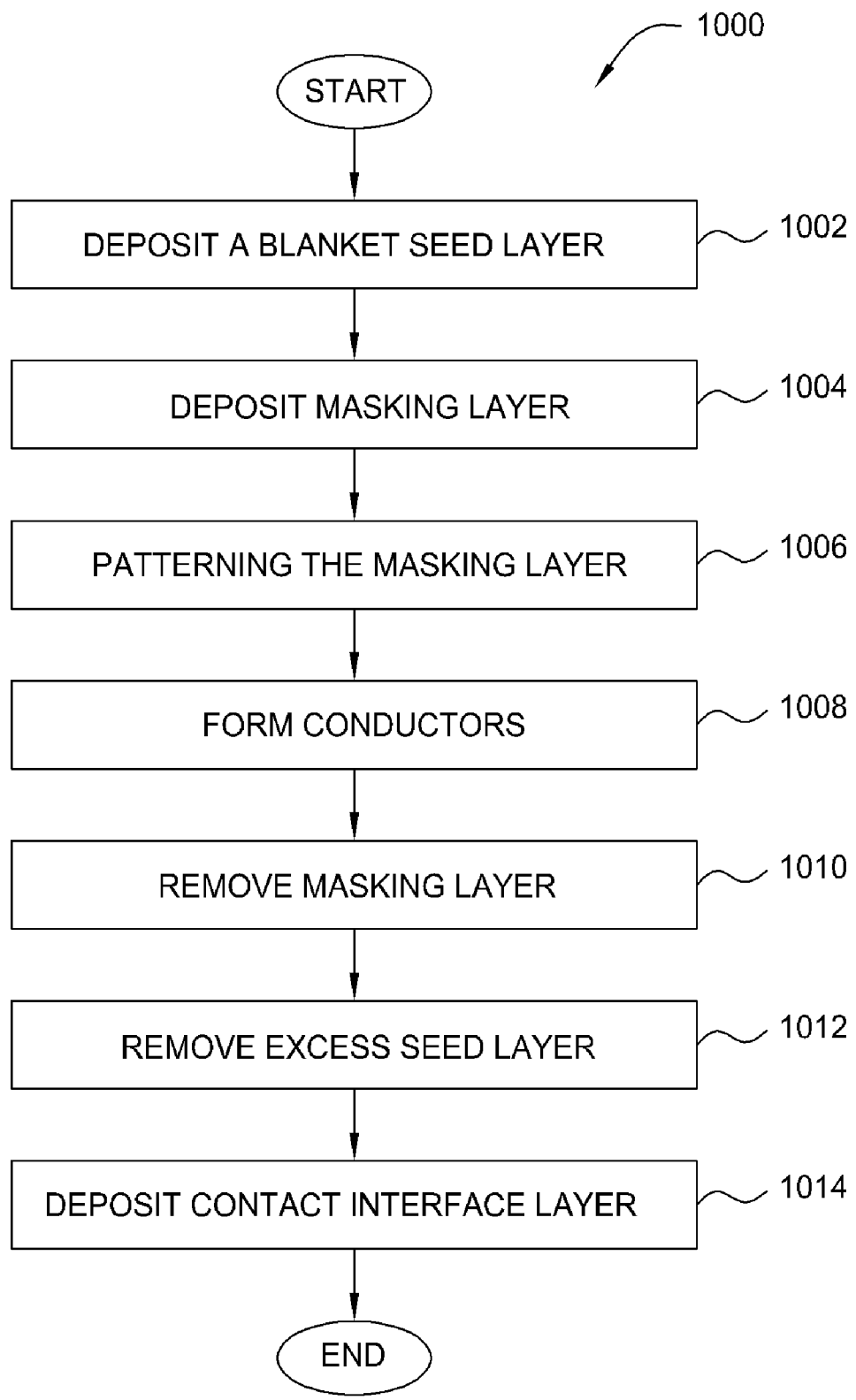
FIG. 10 illustrates a solar cell process sequence according to one embodiment described herein.
Figure 11A:
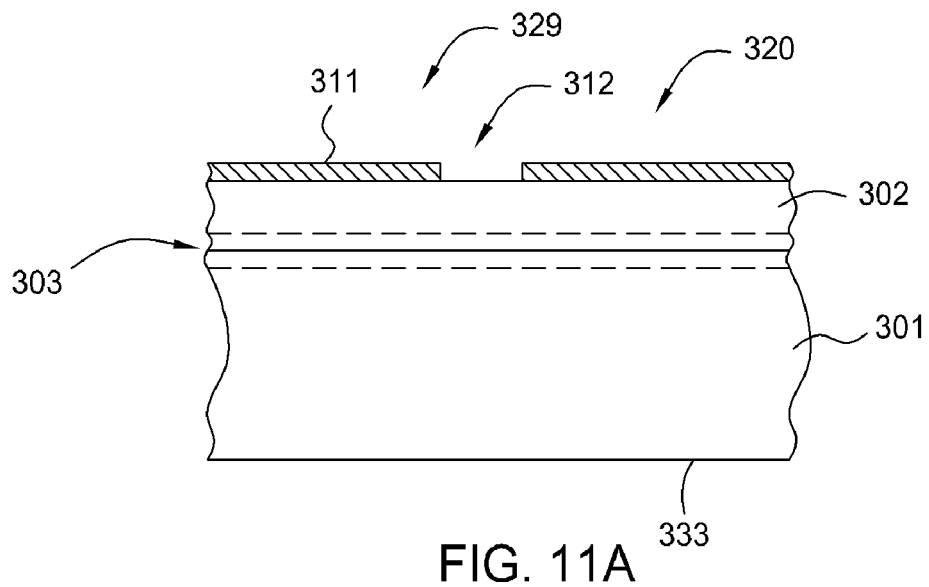
FIGS. 11A-11H illustrate schematic cross-sectional views of a solar cell during different stages of the process sequence described in FIG. 10.
Figure 11B:
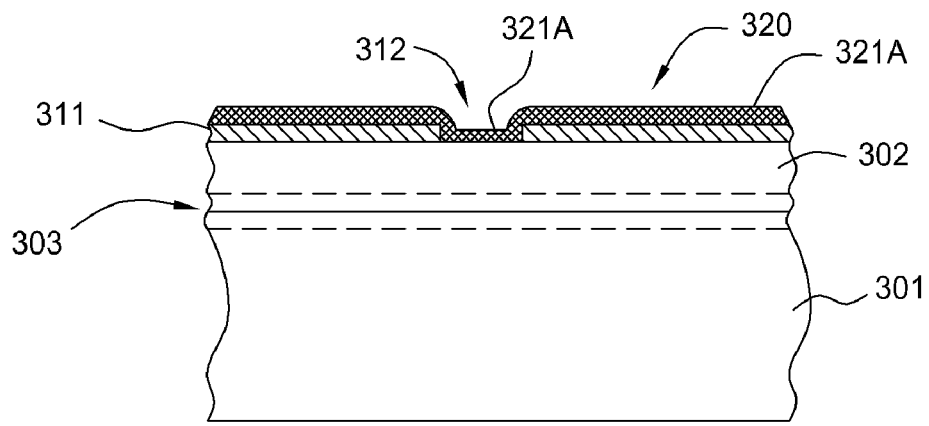

Conventional methods of forming metallized structures using a conventional screen printing type process are unreliable and expensive. In an effort to improve solar cell metallization processes the following methods may be used to form conductors 325 on a surface of the metallized substrate 320. The method includes the use of a multistep process to form a desired pattern of metallized features on the substrate surface. FIG. 10 illustrates a series of method steps 1000 that can be used to form the conductors 325 on a surface of the solar cell substrate. FIGS. 11A-11I illustrate the various states of a metallized substrate 320 after each step of method steps 1000 has been performed. The method steps 1000 start with step 1002 in which a substrate 301 (FIG. 11A) is formed using conventional solar cell and/or semiconductor fabrication techniques. The substrate 301 may be formed using the steps described in step 202, discussed above. In the next step, step 1004 as shown in FIGS. 10 and 11B, blanket seed layer 321A is deposited over the surface of the substrate 301. In general, a blanket seed layer 321A may be deposited using a physical vapor deposition (PVD), chemical vapor deposition (CVD), molecular beam epitaxy (MBE), or atomic layer deposition (ALD) process.

Figure 11C:
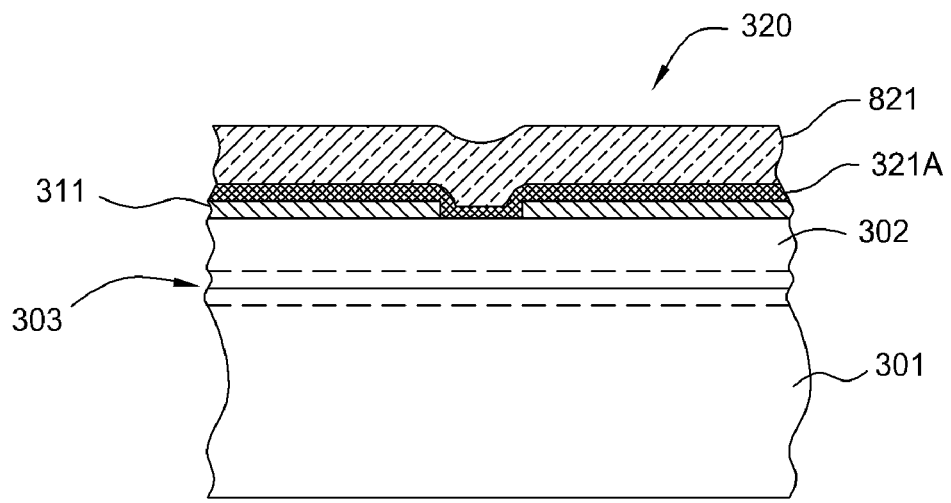

In the next step, step 1004, as shown in FIG. 11C, a masking layer 821 is deposited over the blanket seed layer 321A. In general, the masking layer 821 is a non-conductive material that can be deposited on a surface of the substrate. In one embodiment, the masking layer is an organic material, such as photoresist, that is deposited on the blanket seed layer 321A by use of a conventional spin-coating, CVD or other similar process.

Figure 11D:
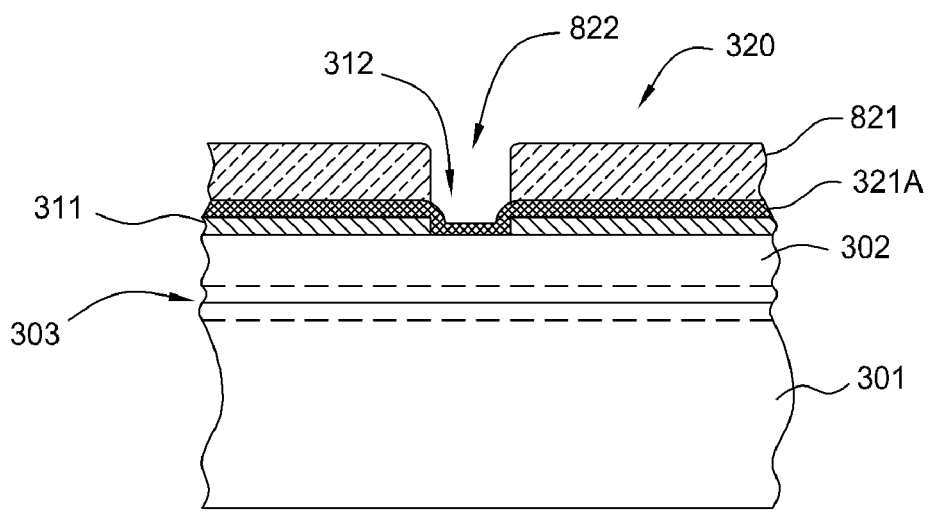
Figure 11E:
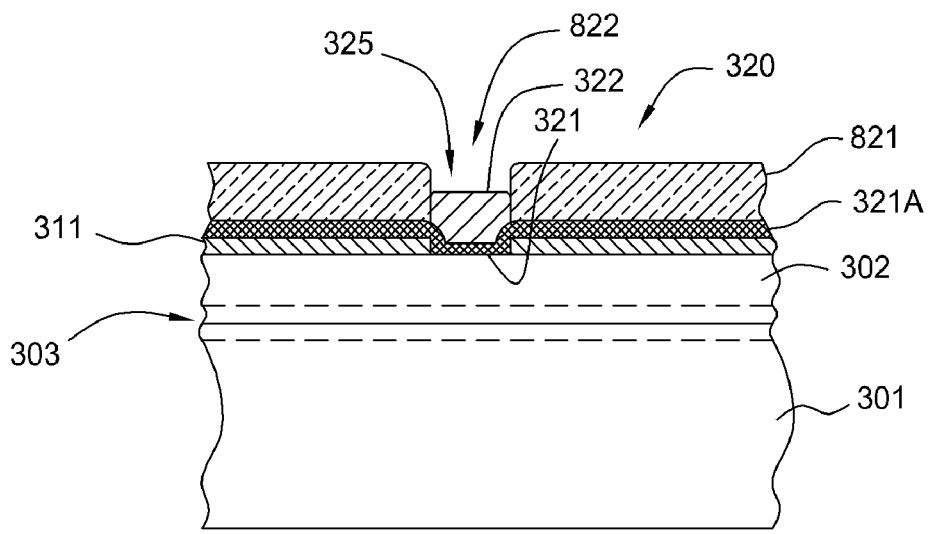

In the next step, step 1006, the masking layer 821 is patterned to expose regions of the substrate surface where conductors are to be formed. Referring to FIG. 11D, during the step 1006 an aperture 822 is formed in the masking layer 821 to expose the blanket seed layer 321A by use of conventional photolithography exposure and chemical develop steps, laser ablation, or other methods of preferentially removing regions of a masking layer.

In one embodiment of the method steps 1000, steps 1004 and 1006 are combined so that a patterned layer is directly formed on the surface of the blanket seed layer 321A. In this case the masking layer 821 is directly formed in a patterned configuration (i.e., having apertures 822 form therein), similar to FIG. 11D, by use of a screen-printing, ink-jet printing, rubber stamping, or other similar process that deposits a material that cannot be "plated on" on the substrate surface. In one embodiment, the masking layer 821 is a non-conductive material, such as an organic material. In this configuration the masking layer 821 that can directly deposits a patterned masking layer material on the surface of the substrate.

In the next step, step 1008, the conductors 325 are formed in the apertures 822 by use of an electrochemical plating process. In one embodiment, step 1008 uses the processes and chemistries described above in conjunction with step 206. In this process step, the blanket seed layer 321A is cathodically biased relative to an electrode (not shown) using a power supply that causes the ions in an electrolyte to form a metal layer 322 on the exposed areas of the blanket seed layer 321A created within the apertures 822. In this configuration the masking plate 410 used in steps 206-208 is not needed, since the masking layer 821 contains a desired pattern that is used to form the deposited conductors 325. In one embodiment, the light-receiving side of the solar cell may have a metal pattern similar to the pattern shown in FIG. 1D, which is discussed above.

Figure 11F:
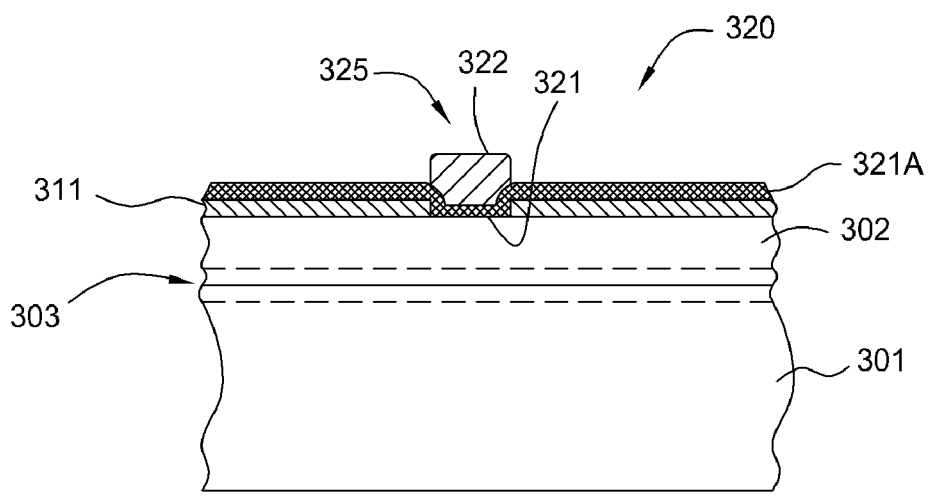

Referring to FIG. 11F, in the next step, step 1010, the patterned masking layer 821 is removed from surface of the blanket seed layer 321A. The masking layer 821 can be removed by use of a liquid solvent, RF plasma oxidation process (e.g., conventional ashing processes), thermal baking processing, or other similar conventional techniques.

Figure 11G:
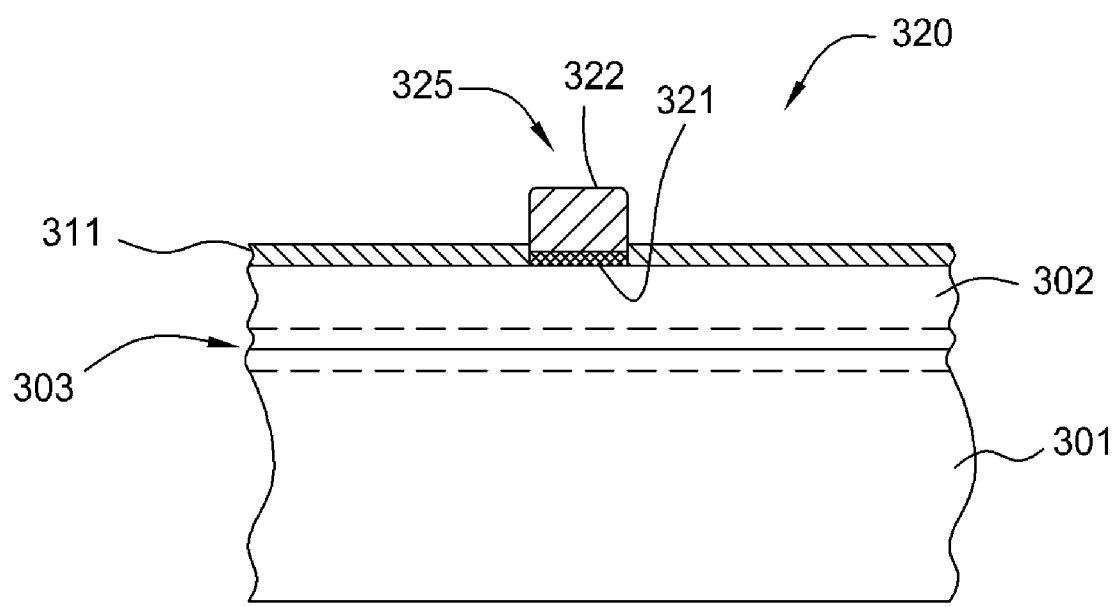

In the next step, step 1012, as shown in FIG. 11G, the blanket seed layer 321A is removed from surface of the substrate. The blanket seed layer removal step generally entails performing a conventional wet or dry etching step to remove any unwanted and/or excess metal on the surface of the substrate, such as unused portions of the blanket seed layer 321A. Conventional wet etching steps may involve immersing the substrate in an acidic or basic solution that is adapted to remove the unwanted and/or excess metal on the surface of the substrate.

Figure 11H:
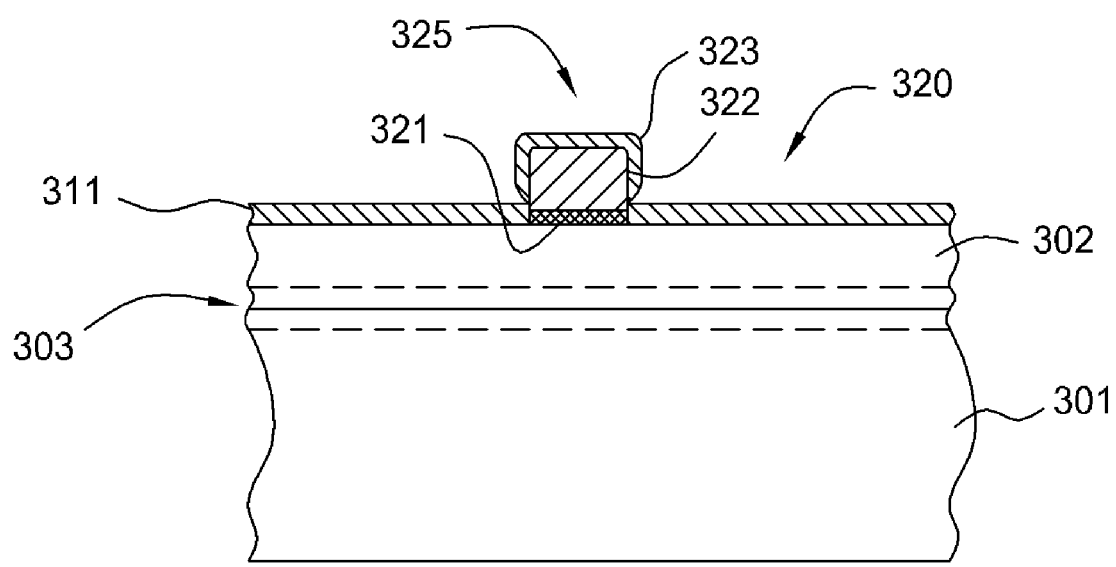

Referring to FIGS. 10 and 11H, in step 1014 an optional contact interface layer 323 is deposited over the surface of the metal layer 322 formed during step 1008. The contact interface layer 323 can be formed using an electrochemical deposition process, an electroless deposition process, a CVD deposition process, or other comparable deposition processes to form a good ohmic contact between the formed conductors 325 and an external interconnection bus (not shown) that is adapted to connect one or more solar cells together. Step 1014 may be used to form the metal layer 323 using of the chemicals and methods described above in conjunction with step 208. In one embodiment of the method steps 1000, the contact interface layer 323 is deposited over the surface of the metal layer 322, using step 1014, prior to removing the patterned masking layer 821 using step 1012.

In one embodiment, a backside metallization process is performed on the metallized substrate 320 by use of a process similar to the one discussed above in conjunction the FIG. 3F, described above.

While the foregoing is directed to embodiments of the present invention, other and further embodiments of the invention may be devised without departing from the basic scope thereof, and the scope thereof is determined by the claims that follow.

We claim:

1. An apparatus for forming a metal layer on a solar cell substrate, comprising:

a masking plate having a body, a first surface and a second surface, the masking plate having a plurality of apertures that extend through the body between the first surface and the second surface;

an electrical contact formed on the first surface of the masking plate and in communication with a first power supply;

a thrust plate that is adapted to urge a metallized surface of a substrate against the electrical contact and the first surface of the masking plate;

a first electrode that is in electrical communication with the first power supply, wherein the first power supply is configured to electrically bias the first electrode relative to the electrical contact; and a second electrode that is in electrical communication with a second power supply which is adapted to bias the second electrode relative to the electrical contact or the first electrode.

2. The apparatus of claim 1, further comprising a pump that is adapted to deliver an electrolyte to a space formed between a portion of a seed layer exposed by the apertures and the electrode.

3. The apparatus of claim 1, wherein the masking plate is formed from a material selected from a group consisting of glass, plastic and ceramic.

4. The apparatus of claim 1, wherein the metallized surface is on a light receiving side of the solar cell substrate and the sum of the cross-sectional areas of the apertures at the first surface of the masking plate is less than 30% of the surface area of the light receiving side of the solar cell substrate.

5. The apparatus of claim 1, wherein the metallized surface is on a non-light receiving side of the solar cell substrate and the sum of the cross-sectional areas of the apertures at the first surface of the masking plate is greater than 70% of the surface area of the non-light receiving side of the solar cell substrate.

6. The apparatus of claim 1, further comprising a diffuser plate that is positioned between the electrode and the metallized surface, wherein the diffuser plate is adapted to rotate relative to the metallized surface of the substrate.

7. The apparatus of claim 1, further comprising a diffuser plate that is positioned between the electrode and the metallized surface, wherein the diffuser plate is adapted to move linearly or vibrate relative to the metallized surface of the substrate.

8. An apparatus for forming a metal layer on a solar cell substrate, comprising:
- a masking plate comprising a body formed of dielectric material, a first surface and a second surface, the masking plate having a plurality of apertures that extend through the body between the first surface and the second surface;
- a plurality of electrical contacts formed on the first surface of the masking plate;
- a thrust plate adapted to urge a surface of a substrate against the plurality of electrical contacts and the first surface of the masking plate;
- an actuator coupled to the thrust plate;
- a first electrode that is in electrical communication with a first power supply, wherein the first power supply is configured to electrically bias the first electrode relative to the plurality of electrical contacts; and
- a second electrode that is in electrical communication with a second power supply which is adapted to bias the second electrode relative to the plurality of electrical contacts or the first electrode.

9. The apparatus of claim 8, wherein the first electrode is non-consummable.

10. The apparatus of claim 8, wherein the first electrode is formed from a material selected from a group consisting of titanium, platinum, copper and phosphorus.

11. The apparatus of claim 10, wherein the first electrode has a plurality of holes disposed therethrough.

12. The apparatus of claim 8, further comprising a diffuser plate that is positioned between the first electrode and the substrate.

13. The apparatus of claim 12, further comprising a polymeric material disposed at least partially on the first surface of the masking plate.

14. The apparatus of claim 12, further comprising a pump that is adapted to deliver an electrolyte to a space formed between a portion of the seed layer exposed by the plurality of apertures and the first electrode.

15. The apparatus of claim 14, wherein the plurality of electrical contacts are formed from a material selected from the group consisting of platinum, gold, nickel, graphite and copper.

16. An apparatus for forming a metal layer on a solar cell substrate, comprising:
- a masking plate comprising a body, a first surface and a second surface, the masking plate having a plurality of apertures that extend through the body between the first surface and the second surface;
- a plurality of electrical contacts at least partially recessed within the first surface of the masking plate;
- a thrust plate adapted to urge a surface of a substrate against the plurality of electrical contacts and the first surface of the masking plate;
- a first electrode electrically coupled to a first power supply, the first electrode having a plurality of holes disposed therethrough; and
- a second electrode that is in electrical communication with a second power supply which is adapted to bias the second electrode relative to the plurality of electrical contacts or the first electrode.

17. The apparatus of claim 16, wherein the masking plate is formed from a material selected from a group consisting of glass, plastic and ceramic.

18. The apparatus of claim 17, further comprising a polymeric material disposed at least partially on the first surface of the masking plate.

19. The apparatus of claim 16, further comprising a diffuser plate that is positioned between the first electrode and the substrate.

20. The apparatus of claim 16, wherein the first electrode is non-consumable.

21. The apparatus of claim 16, wherein the plurality of electrical contacts comprise conductive clips or conductive pins.

22. The apparatus of claim 21, wherein the plurality of electrical contacts are formed from a material selected from the group consisting of platinum, gold, nickel, graphite or copper.

23. An apparatus for forming a metal layer on a solar cell substrate, comprising:
- a tank that has a processing region which is adapted to retain a volume of an electrolyte;
- an array of plating cells positioned in the processing region, wherein each plating cell in the array comprises:
  - a masking plate having a body, a first surface and a second surface, the masking plate having a plurality of apertures that extend through the body between the first surface and the second surface;
  - an electrical contact formed on the first surface of the masking plate and in communication with a first power supply;
  - a thrust plate that is adapted to urge a metallized surface of a substrate against the electrical contact and the first surface of the masking plate;
  - a first electrode that is in electrical communication with the first power supply, wherein the first power supply is configured to electrically bias the first electrode relative to the electrical contact; and a second electrode that is in electrical communication with a second power supply which is adapted to bias the second electrode relative to the electrical contact or the first electrode.

24. The apparatus of claim 23, wherein the electrical contact is formed from a material selected from the group consisting of platinum, gold, nickel, graphite and copper.

25. The apparatus of claim 23, wherein the masking plate is formed from a material selected from a group consisting of glass, plastic and ceramic.

26. The apparatus of claim 23, further comprising a pump that is adapted to deliver an electrolyte to each of the plating cells positioned in the processing region.

27. The apparatus of claim 23, wherein the first electrode is formed from a material selected from a group consisting of titanium, platinum, copper and phosphorus.

28. The apparatus of claim 23, further comprising a controller that is adapted to control the power supply in each plating cell so that a metal layer can be formed on each substrate at the same time.

* * * * *

UNITED STATES PATENT AND TRADEMARK OFFICE
CERTIFICATE OF CORRECTION

PATENT NO. : 7,704,352 B2  
APPLICATION NO. : 11/566202  
DATED : April 27, 2010  
INVENTOR(S) : Lopatin et al.

Page 1 of 1

It is certified that error appears in the above-identified patent and that said Letters Patent is hereby corrected as shown below:

Column 18, Line 9, please delete "($CuSO_4.5(H_2O)$)" and insert --($CuSO_4 \cdot 5(H_2O)$)-- therefor.

Signed and Sealed this

Third Day of August, 2010

David J. Kappos  
*Director of the United States Patent and Trademark Office*